(12) United States Patent
Bedeschi

(10) Patent No.: US 11,996,139 B2
(45) Date of Patent: May 28, 2024

(54) MEMORY DEVICE WITH IMPROVED DRIVER OPERATION AND METHODS TO OPERATE THE MEMORY DEVICE

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/611,253

(22) PCT Filed: Dec. 9, 2020

(86) PCT No.: PCT/IB2020/020077
§ 371 (c)(1),
(2) Date: Nov. 15, 2021

(87) PCT Pub. No.: WO2022/123283
PCT Pub. Date: Jun. 16, 2022

(65) Prior Publication Data
US 2024/0013831 A1    Jan. 11, 2024

(51) Int. Cl.
*G11C 11/4096* (2006.01)
*G11C 11/404* (2006.01)

(52) U.S. Cl.
CPC ...... *G11C 11/4096* (2013.01); *G11C 11/4045* (2013.01)

(58) Field of Classification Search
CPC .............................. G11C 8/08; G11C 11/4085
USPC ..................................... 365/189.011
See application file for complete search history.

(56) References Cited

U.S. PATENT DOCUMENTS

| | | | |
|---|---|---|---|
| 6,233,198 B1 | 5/2001 | Choi | |
| 8,072,834 B2* | 12/2011 | Khamesra | G11C 5/148 |
| | | | 365/230.06 |
| 8,270,222 B2 | 9/2012 | Liao | |
| 9,251,890 B1 | 2/2016 | Agarwal et al. | |
| 9,430,417 B2 | 8/2016 | Tanzawa | |
| 11,545,219 B2* | 1/2023 | Bedeschi | G11C 16/0433 |
| 2008/0144389 A1 | 6/2008 | Chen et al. | |

(Continued)

FOREIGN PATENT DOCUMENTS

| | | |
|---|---|---|
| CN | 1477639 A | 2/2004 |
| CN | 101506896 A | 8/2009 |

(Continued)

OTHER PUBLICATIONS

Taiwan Office Action for TW Application No. 110143898, dated Aug. 3, 2022, 7 Pages.

(Continued)

*Primary Examiner* — Anthan Tran
(74) *Attorney, Agent, or Firm* — Fletcher Yoder, P.C.

(57) ABSTRACT

The present disclosure describes a memory device comprising memory cells at cross points of access lines of a memory array, and a two-transistor driver comprising a P-type transistor and a N-type transistor connected to the P-type transistor, the two-transistor driver being configured to drive an access line of the memory array to a discharging voltage during an IDLE phase, to drive said access line to a floating voltage during an ACTIVE phase, and to drive said access line at least to a first or second read/program voltage during a PULSE phase.

30 Claims, 17 Drawing Sheets

(56) References Cited

U.S. PATENT DOCUMENTS

| | | | |
|---|---|---|---|
| 2009/0116304 A1* | 5/2009 | Kim | G11C 8/08 |
| | | | 365/230.06 |
| 2009/0231931 A1 | 9/2009 | Lines | |
| 2010/0054019 A1 | 3/2010 | Toda | |
| 2013/0250695 A1 | 9/2013 | Chen et al. | |
| 2015/0071019 A1 | 3/2015 | Toda | |
| 2018/0075912 A1 | 3/2018 | Shimizu et al. | |
| 2018/0299939 A1 | 10/2018 | Kiyozaki | |

FOREIGN PATENT DOCUMENTS

| | | |
|---|---|---|
| KR | 10-2014-0080380 A | 6/2014 |
| TW | I470634 B | 1/2015 |

OTHER PUBLICATIONS

International Search Report and Written Opinion issued in PCT/US2020/020077, dated Sep. 3, 2021 (9 pages).

Chinese Office Action for CN Application No. 202080107746.6, dated Oct. 21, 2023, 12 Pages.

* cited by examiner

MEMORY DEVICE WITH IMPROVED DRIVER OPERATION AND METHODS TO OPERATE THE MEMORY DEVICE

BACKGROUND

The present disclosure relates generally to memory devices and more specifically to memory devices comprising two-transistor drivers including P-type and N-type transistors and methods thereof.

Memory devices are widely used to store information in various electronic devices such as computers, smartphones, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory cells may lose their stored state over time unless they are periodically refreshed by an external power source.

Cost reduction, power consumption reduction, as well as device performances are increasingly relevant in most advanced memory devices. Scaling technology, e.g., adopting manufacturing techniques with smaller feature size however, is adding considerable processing cost. Some technologies, such as three-dimensional (3D) technologies, exploit the vertical dimension of the chip to form memory cells so as to improve the ratio between memory capacity and estate. Finding more cost effective and more performant solutions, especially with reduced power consumption, is highly desirable, especially for array-related circuits, such as access line drivers.

DETAILED DESCRIPTION

Figure 1:
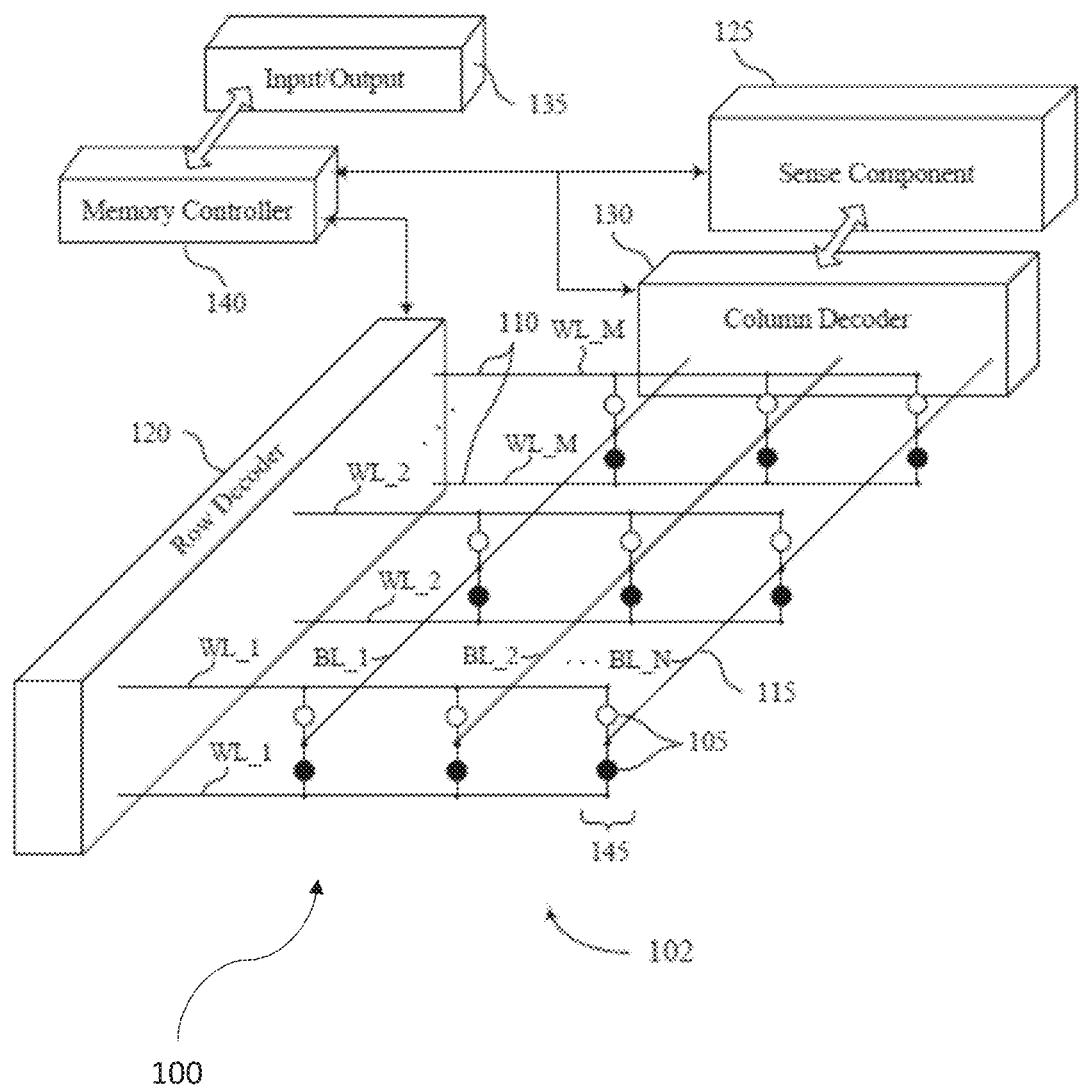
FIG. 1 illustrates an exemplary diagram of a memory device including an array of memory cells that supports two-transistor drivers in accordance with embodiments of the present disclosure.

Digital information storage is more and more demanding. Different technologies are available to store bits of information in logical states of a memory cell. Independently of the physical mechanisms that allow information storage, a denser and denser packing is required. Additionally, performance must be constantly increased, for example in terms of shorter and shorter access time, and minimum power consumption is desirable, especially for mobile or battery supplied applications.

The present disclosure relates to a memory array architecture, especially suited for non-volatile data storage, that allows very dense packing of memory cells and very low consumption during operation. The memory architecture comprises two-transistor drivers, more in particular P-type and N-type transistor drivers for driving access lines to a positive and a negative read/program voltage, depending on the command being executed. Memory cells may be at intersections of word lines and digit lines, e.g., in cross-point memory array organization, such as in a multi-deck 3D memory array. Read/program voltage splitting may be adopted to limit voltage stress in drivers and in memory cells and to reduce leakage in the array.

State of art decoders based on P-type and N-type transistors consume a significant amount of power at every polarity transition and must account for P and N wells extra-space distance under the patch. On the other hand, the use of drivers comprising three transistors is more demanding from Area perspective. The use of decoders comprising two N-type transistors (which must be symmetrical) requires gate overvoltage to drive the programming current with positive polarity and it is difficult to enable simultaneous multi-bit per tile programming. Moreover, oxide and junction voltages (including pre-decoders) are challenging indicators to meet reliability and stress criteria. The present disclosure thus provides for an improved operation of a decoder comprising a P-type transistor and a N-type transistor.

According to the disclosed solution, operation of the decoder may be subdivided in different phases, such as an IDLE phase, an ACTIVE phase and a PULSE phase. The present disclosure teaches how each access line is decoded and biased during each of these phases. In particular, during an IDLE phase, all access lines are biased to a discharge voltage (e.g., a ground voltage), during an ACTIVE phase all access lines are biased to a floating voltage, and during a PULSE phase, addressed access lines are biased to the desired (positive or negative) read/program voltage while access lines that are physically adjacent to or grouped with the addressed lines are biased to a shielding voltage (e.g., a ground voltage) and unrelated access lines (e.g., neither adjacent to nor grouped with the addressed lines) are kept at a floating voltage. After execution of an access operation (e.g., on exiting from a PULSE phase) the memory device returns in an ACTIVE phase and stays there waiting until a new command is received. A threshold number of access operations and/or a timeout may be used to limit permanence in the ACTIVE phase and periodically trigger the IDLE phase so as to reduce leakage phenomena.

The working conditions of the two-transistor driver according to the present disclosure are such that the transistor nodes are biased to voltages never exceeding maximum reliability transistor rating during any of the IDLE, ACTIVE and PULSE phases.

Features of the disclosure are initially described in the context of a memory device and memory die as described with reference to FIGS. 1-3. Features of the disclosure are then described in the context of a driver or group of drivers as described with reference to FIGS. 4-6. Features of the disclosure are then described in the context of driver and array configurations as described with reference to FIGS. 7 to 9. Other features of the disclosure are further illustrated by phase diagrams and corresponding methods in relation to operation of the memory device described with references to FIGS. 10-12, as well as in relation to an apparatus diagram described with reference to FIG. 13.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two and may vary according to the needs and/or circumstances. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing an access line for both as explained below. In some cases, the memory cells may be multi-level memory cells configured to store more than one bit of data using multi-level storage techniques.

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) to one another and may create an array of memory cells. As shown in FIG. 1, the two memory cells 105 in a memory cell stack 145 may share a common conductive line such as a bit line 115. That is, a bit line 115 may be coupled with the bottom electrode of the upper memory cell 105 and the top electrode of the lower memory cell 105. Other configurations may be possible, for example, a third deck may share a word line 110 with a lower deck. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are coupled with (e.g., connected to) the same word line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive material, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting word line 110 and bit line 115. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled BL_1 through BL_N, where M and N depend on the array size. Thus, by activating a word line 110 and a bit line 115, e.g., WL_2 and BL_3, the memory cell 105 at their intersection may be accessed. As discussed below in more detail, accessing memory cells 105 may be controlled through a row decoder 120 and a column decoder 130 that may include one or more doped materials that extend in a direction away from a surface of a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some examples, a memory cell 105 may be programmed by providing an electric pulse to the cell, which may include a memory storage element. The pulse may be provided via word line 110, bit line 115, or a combination thereof.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or coupled with column decoder 130 or row decoder 120. The sense component may be associated either with column decoder or row decoder.

A memory cell 105 may be set or written by activating the relevant word line 110 and bit line 115 and at least one logic value may be stored in the memory cell 105. Column decoder 130 or row decoder 120 may accept data, for example input/output 135, to be written to the memory cells 105. In the case of a memory cell including a chalcogenide material, a memory cell 105 may be written to store a logic state in the memory cell 105 by applying the first voltage to the memory cell 105 as part of the access operation based on coupling the first conductive line of the decoder (e.g., row decoder 120 or column decoder 130) with the access line (e.g., word line 110 or bit line 115).

The memory device 100 may be in an IDLE phase (or first phase); an IDLE phase may be a configuration with low power consumption, for example. In some examples the memory device 100 may be in an ACTIVE phase (or second phase); an ACTIVE phase may be a configuration in which the memory device is immediately ready to execute received commands, for example. In some examples, the memory device may be in a PULSE phase (or third phase); a PULSE phase may be a configuration during which a command is executed, for example, e.g., a target memory cell is accessed and biased to program or to read a logic state into or from the memory cell.

Based on the memory device phase (e.g., IDLE phase, ACTIVE phase or PULSE phase, among others), the memory controller 140 may control the operation and voltages (e.g., read, write, re-write, refresh, discharge, shield, float) of memory cells 105 through the various components, for example, row decoder 120, column decoder 130, and sense component 125. In some cases, one or more of the row decoder 120, column decoder 130, and sense component 125 may be co-located with the memory controller 140.

Memory controller 140 may generate row and column address signals to activate the desired word line 110 and bit line 115. Memory controller 140 may also generate and control various other voltages or currents used during the operation of memory device 100. For example, memory controller 140 may bias to a shielding voltage (e.g., a ground voltage) access lines adjacent to the target access line and/or access lines in a same group as the addressed access line. Memory controller 140 may also float other access lines unrelated to the addressed access line.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with an access line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may store a logic state in the memory cell 105 based on applying the first voltage to the memory cell 105.

In some examples, the memory controller 140 may modify a state of the memory device 100 based on receiving the command. For example, the memory controller 140 may implement a transition from an IDLE phase to an ACTIVE phase based on receiving an access command. For example, the memory controller 140 may implement a transition from an ACTIVE phase to a PULSE phase based on receiving an access command. For example, the memory controller 140 may implement a transition from a PULSE phase back to an ACTIVE phase based on completion of a PULSE phase command. For example, the memory controller 140 may implement a transition from an ACTIVE phase back to an IDLE phase based on an access counter or a time counter meet respective threshold, as it will be described in detail below. For example, the memory controller 140 may keep memory device 100 in an ACTIVE phase if the access counter and the time counter are below respective threshold.

Figure 2:
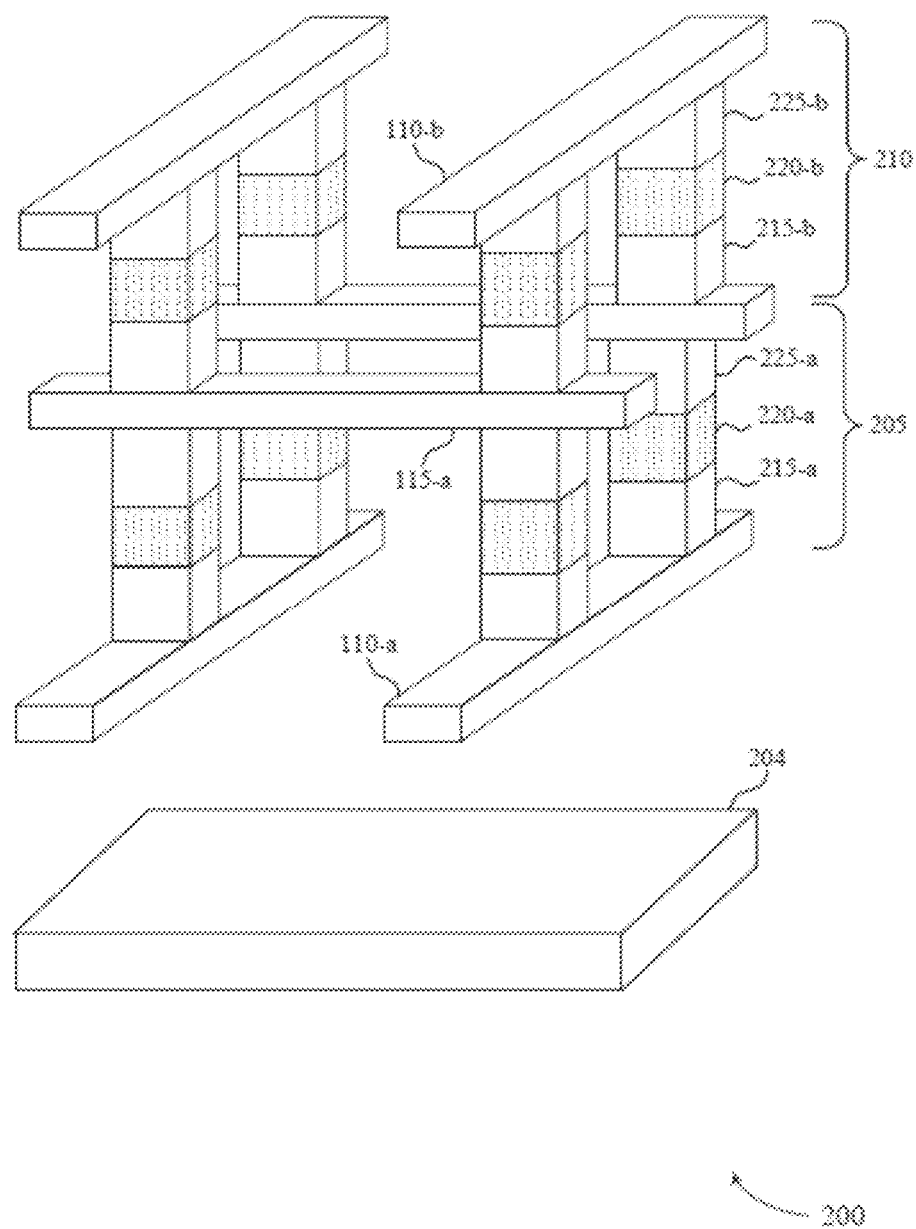
FIG. 2 illustrates a perspective view of an exemplary 3D memory array supporting two-transistor drivers in accordance with embodiments of the present disclosure.

FIG. 2 illustrates a perspective view of an exemplary 3D memory array supporting two-transistor drivers in accordance with embodiments of the present disclosure. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Memory array 200 may also include word line 110-*a* and word line 110-*b*, and bit line 115-*a*, which may be examples of word line 110 and bit line 115, as described with reference to FIG. 1. Memory cells of the first deck 205 and the second deck 210 each may have one or more memory cell (e.g., memory cell 220-*a* and memory cell 220-*b*, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 215-*a*, memory cell 220-*a* (e.g., including chalcogenide material), and second electrode 225-*a*. In addition, memory cells of the second deck 210 may include a first electrode 215-*b*, memory cell 220-*b* (e.g., including chalcogenide material), and second electrode 225-*b*. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled to bit line 115-*a* such that bit line 115-*a* is shared by vertically adjacent memory cells. In accordance with the teachings herein, a decoder may be positioned above or below each deck if the memory array 200 includes more than one deck. For example, a decoder may be positioned above first deck 205 and above second deck 210. In some cases, the memory cells 220 may be examples of phase-change memory cells or self-selecting memory cells.

The architecture of memory array 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms.

In some examples, a memory cell 220 including chalcogenide material may be programmed to a logic state by applying a first voltage. By way of example and without being bound by a particular theory, when a particular memory cell 220 is programed, elements within the cell separate, causing ion migration. Ions may migrate towards a particular electrode, depending on the polarity of the voltage applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

In some cases, a first voltage may be applied to a first conductive line of a decoder as part of an access operation of the memory cell 220. Upon applying the first voltage, the first conductive line may be coupled with the access line (e.g., word line 110-*a*, word line 110-*b*, or bit line 115-*a*) associated with the memory cell 220. In some examples, a shielding voltage may be applied to a second conductive line of the decoder and the second conductive line may be coupled to an access line adjacent to the addressed access line or to an access line grouped with the addressed access line. In some examples, a floating voltage may be applied to access lines that are neither adjacent to nor grouped with the addressed access line (e.g., other access lines in the same deck as the addressed access line—not shown in FIG. 2).

Figure 3:
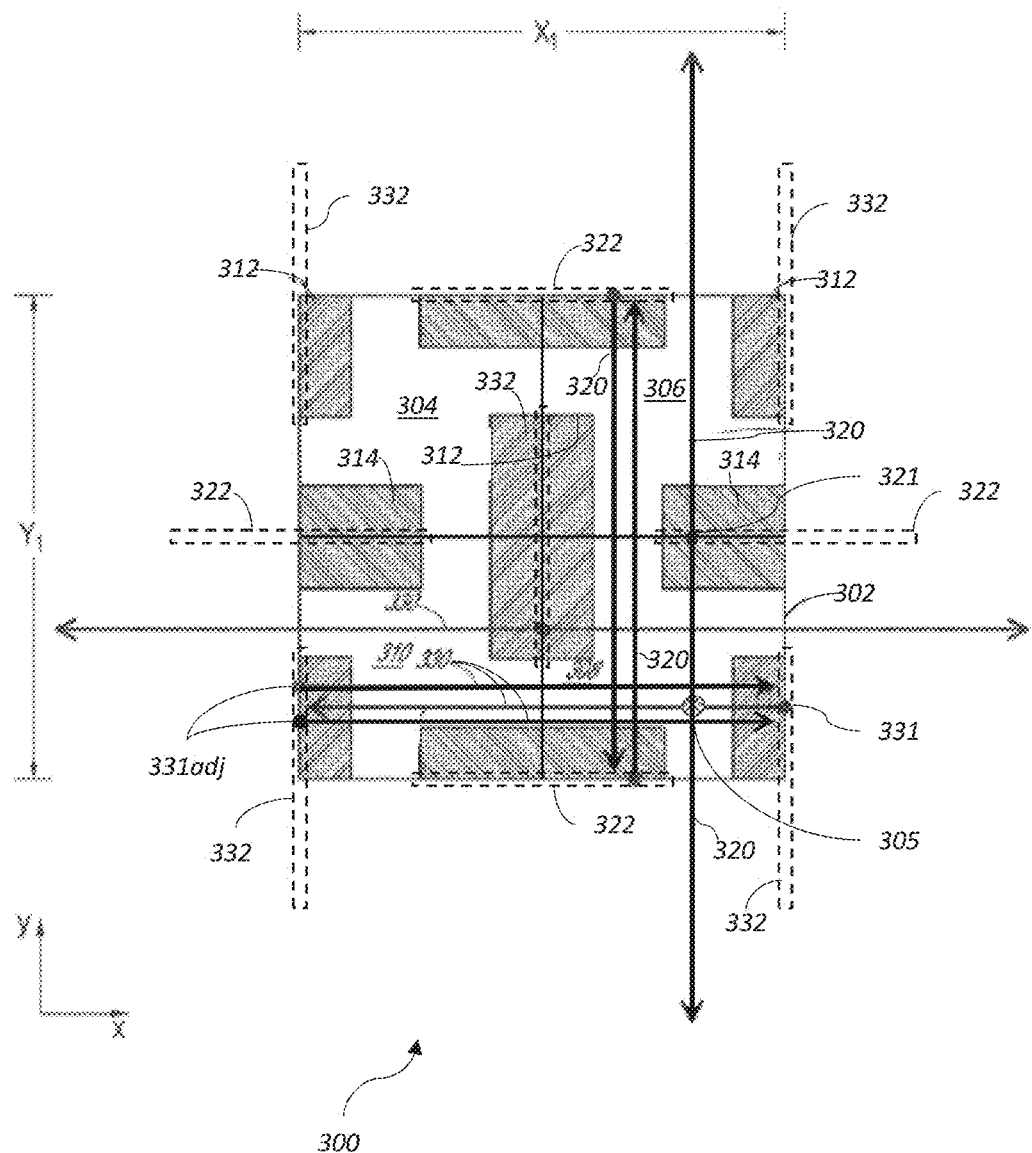
FIG. 3 illustrates an example block layout of decoding circuitry of a 3D memory array that supports two-transistor drivers in accordance with embodiments of the present disclosure.

FIG. 3 illustrates an example block layout of decoding circuitry of a 3D memory array that supports two-transistor drivers in accordance with embodiments of the present disclosure. In the example depicted in FIG. 3, a memory architecture 300 of the present invention comprises an active memory array 302 that is partitioned into multiple sub-arrays. In this example, there are four sub-arrays 304, 306, 308 and 310. Thus, a length of Y1 spanned by a digit line 320 extending towards one of the two opposite sides of the y-axis is equivalent to a length of two sub-arrays in the y-direction. Similarly, a length of X1 spanned by a word line 330 extending towards one of the two opposite sides of the x-axis is equivalent to a length of two sub-arrays in the x-direction.

Word line drivers 312 may be located substantially within the footprint of the active array and near the periphery of the sub-arrays. Digit line drivers 314 may also be located substantially within the footprint of the active array and near the periphery of the sub-arrays. It will be understood that each shaded area comprises a region that can include multiple driver circuits. In the illustrated embodiment, individual sub-array layouts in a plan view comprise a "mirror"

copy of a layout of adjacent sub-arrays. That is, in sub-array 304 the word line drivers 312 are in the upper left and lower right corners of the sub-array, and extend generally along the edges along the y-direction to connect with word lines 314 extending in the x-direction. It is noted that the word line drivers 312 are coupled to a central location of the word lines, which cross boundaries between adjacent sub-arrays. The digit line drivers 314 are in the upper right and lower left corners of sub-array 304, and extend generally along the edges extending in the x-direction to connect with digit lines 320 extending in the y-direction.

Digit line drivers 314 are in the lower right and upper left corners of the sub-arrays, and extend generally along the edges that extending in the x-direction to connect with digit lines 330 that extend in the y-direction. It is noted that the digit line drivers 314 are coupled to a central location of the digit lines 330 which cross boundaries between adjacent sub-arrays. In adjacent sub-array 306 the word line drivers 312 are in the lower left and upper right corners of the sub-arrays, and extend generally along the vertical edges to connect with horizontally extending word lines. Thus in a plan view the layout of the drivers is a mirror image between adjacent sub-arrays 304 and 306. Similar mirroring can be seen between sub-arrays 304 and 310, between sub-arrays 306 and 308 and between sub-arrays 310 and 308, as depicted in FIG. 3.

In array architecture of FIG. 3, socket interconnect regions 322 for digit lines 320 and socket interconnect regions 332 for word lines 330 of the memory array 302 are present above digit drivers 314 and word line drivers 312, respectively. It is noted that the socket regions are at the boundaries of the sub-arrays. By breaking the word and digit line drivers and socket regions into small segments and staggering the lines or groups of lines in alternate rows, as illustrated in FIG. 3, the word lines and digit lines can extend through the active array 302 and through the socket regions.

A target or addressed memory cell 305 (such as memory cells of FIGS. 1 and 2) may be at the intersection of an addressed digit line 321 and an addressed word line 331; addressed digit line 321 and word line 331 are decoded and biased by respective driver 314 for digit line and 312 for word line. In the memory array 302, an addressed access line (for example addressed word line 331) has adjacent access lines (for example, word lines 330*adj*). During an access operation targeting the addressed word line (e.g., during a PULSE phase), the adjacent access lines are not addressed and may be biased to a shielding voltage through respective drivers, that may be two-transistor drivers in some embodiments. Similar considerations may apply to digit lines 320, so unaddressed digit lines (not shown) adjacent to the addressed digit line, may be biased to a shielding voltage, for example a ground voltage, during a PULSE phase.

It should be noted that, in the example depicted in FIG. 3, unaddressed word lines 330*adj* adjacent to the addressed word line 331, are decoded and biased by a respective driver 312 in the left-bottom portion of the Figure, while the addressed word line is decoded and biased by a driver 312 in the right-bottom portion of the Figure. In other embodiments, drivers 312 of addressed and of adjacent unaddressed word lines (and/or digit lines) may be physically located close to each other, e.g., in a same word line driver portion (respectively in a same digit line driver portion). The same driver portion may also comprise drivers of other unaddressed word lines (respectively digit lines), either grouped with the addressed word line or completely unrelated to it.

Other unaddressed access lines (either digit lines or word lines, or both) may be floated by respective driver during an access operation, as it will be described below. Some of the access lines may be grouped, for example may share a decoding signal, and unaddressed access lines in the same group of an addressed access line may be biased to a shielding voltage, e.g., a ground voltage, during a PULSE phase.

The access lines drivers, e.g., the word line drivers 312 and/or the digit line drivers 314 may comprise a two-transistor driver. Each two-transistor driver may be configured to drive a respective access line to a discharging voltage during an IDLE phase, to drive the access line to a floating voltage during an ACTIVE phase, and to drive the access line to a read/program voltage or to a shielding voltage or to a floating voltage during a PULSE phase, as it will be described in detail below.

Figure 4:
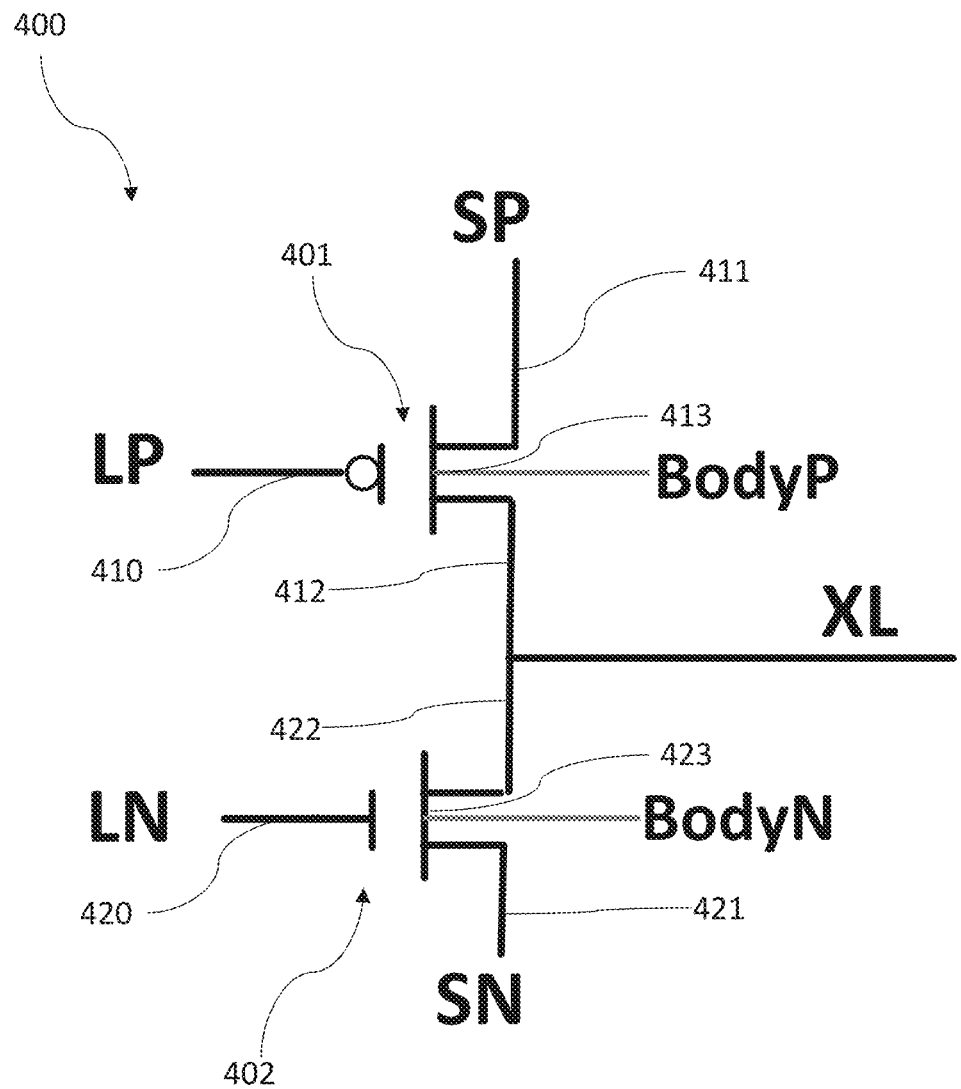
FIG. 4 illustrates an example of two-transistor driver including a P-type transistor and a N-type transistor for a memory device in accordance with embodiments of the present disclosure.

FIG. 4 illustrates an example of a two-transistor driver 400 for a memory device in accordance with embodiments of the present disclosure. The two-transistor driver 400 comprises a P-type transistor 401 and N-type transistor 402. The P-type transistor 401 comprises a gate node 410 coupled to signal line LP, a source node 411 coupled to a signal line SP, a drain node 412 coupled to an access line XL, and a body node 413 biased at voltage BodyP. The N-type transistor 402 comprises a gate node 420 coupled to signal line LN, a source node 421 coupled to a signal line SN, a drain node 422 coupled to the access line XL, and a body node 423 biased at voltage BodyN. The voltage of the access line XL may be determined based on decoding and biasing of the other nodes of the driver 400. In some embodiments, the transistors may be CMOS transistors; in some embodiments the transistors may be FinFET transistors; in some embodiments the transistors may be vertical Thin Film Transistor (TFT). Other types of transistors are also possible and are within the scope of the present disclosure.

The driver 400 is suitable to drive an access line (e.g., word lines 110 and/or digit lines 115 in FIGS. 1 and 2 or word lines 330 and/or digit lines 320 in FIG. 3, for example) to the desired voltage during any of the operative phases of a memory device, such as the memory device 100 of FIG. 1. For example, the driver 400 may be incorporated in row decoder 120 and/or in column decoder 130 of FIG. 1 or in word line drivers 312 and/or digit line drivers 314 of FIG. 3. Memory device, for example memory device 100 in FIG. 1, may operate in different states or phases; among the possible operative phases are: an IDLE phase, an ACTIVE phase and a PULSE phase. In the context of the present disclosure, the term "driver" and "decoder" may also be used as synonymous.

According to the present disclosure, the driver 400 may be configured to drive access line XL to a discharging voltage during the IDLE phase, to drive access line XL to a floating voltage during the ACTIVE phase, and to drive the addressed access line XL to an access voltage (e.g., a read/program voltage) during the PULSE phase. The driver 400 is further configured to drive an unaddressed access line that is physically adjacent to an address access line (driven by a different driver) to a shielding voltage during the PULSE phase. The driver 400 is further configured to drive an unaddressed access line that is grouped with an addressed access line (driven by a different driver that shares, for example a common gate signal line with the access line XL) to a shielding voltage during the PULSE phase. Furthermore, the driver 400 is configured to drive an unaddressed access line that is adjacent to an addressed access line to a shielding voltage during the PULSE phase (for example, an odd driver may drive to a ground voltage an odd address line physically adjacent to an even addressed line while the addressed access line is driven to a read/program voltage by its own driver). Additionally, the driver 400 is configured to drive an unaddressed access line that is unrelated to an addressed access line (e.g., it is not adjacent to the addressed access line) to a floating voltage during the PULSE phase (for example, an odd driver or an even driver may drive to a ground voltage the respective odd/even address line not physically adjacent to an even addressed line while the addressed access line is driven to a read/program voltage by its own driver).

The discharging voltage may be a ground voltage (e.g., 0V) in some examples. The floating voltage may be a voltage that is not biased; the floating voltage may remain substantially unchanged with respect to the last biased voltage. In some cases, the floating voltage may be slightly modified by voltage of surrounding lines and nodes that may be capacitively coupled to the floating node. The access voltage may be a positive programming voltage (e.g., +3.6V) or a negative programming voltage (e.g., −3.6V). The shielding voltage may be a ground voltage (e.g., 0V) in some examples.

The voltage values above may be examples of access voltages for memory cells 105, 205, 305 when using a split voltage approach, for example. In a split voltage approach, the total voltage applied to a memory cell (e.g., the voltage drop between a digit line and a word line coupled to the memory cells) may be obtained by any convenient combination of respective voltages on the digit line and the word line. In some cases, the total voltage may be split in two portions of substantially same amplitude, or magnitude, but opposite polarity; so, for example, a program/read voltage of 7.2V may be obtained applying +3.6V at one node and concurrently applying −3.6V at the other node. A memory architecture may feature the two-transistor driver herein disclosed both to drive the digit line and to drive the word line. In the following description, reference is made to one access line driver only (e.g., the word line driver or the digit line driver), being understood that the same or a similar solution may be implemented to another access line driver (e.g., the digit line driver or the word line driver). The voltage values above are only indicative and operation of the driver 400 is essentially unchanged even if different values are targeted.

The two-transistor driver 400 is configured to provide the discharge voltage to access line(s) through a N-type transistor 402. The two-transistor driver 400 is configured to provide shielding voltages to unaddressed access line(s) through a N-type transistor 402. The two-transistor driver 400 is configured to provide negative read/program voltages to addressed access line(s) through a N-type transistor 402. The two-transistor driver 400 is configured to provide positive read/program voltages to addressed access line(s) through a P-type transistor 401. Generally speaking, the driver 400 is configured to transfer the voltage provided by signal lines SP or SN to the access line XL based, at least in part, on a voltage provided by signal lines LP and LN at the gate nodes 410 and 420 of the transistors. In some examples, body nodes 413 and 423 voltage may be kept at an appropriate constant voltage (e.g., a voltage suitable to avoid forward biasing of any junction of the transistors) through signal lines BodyP and BodyN; for example, at a value −3.6V, or ground voltage, or +3.6V.

Figure 5A:
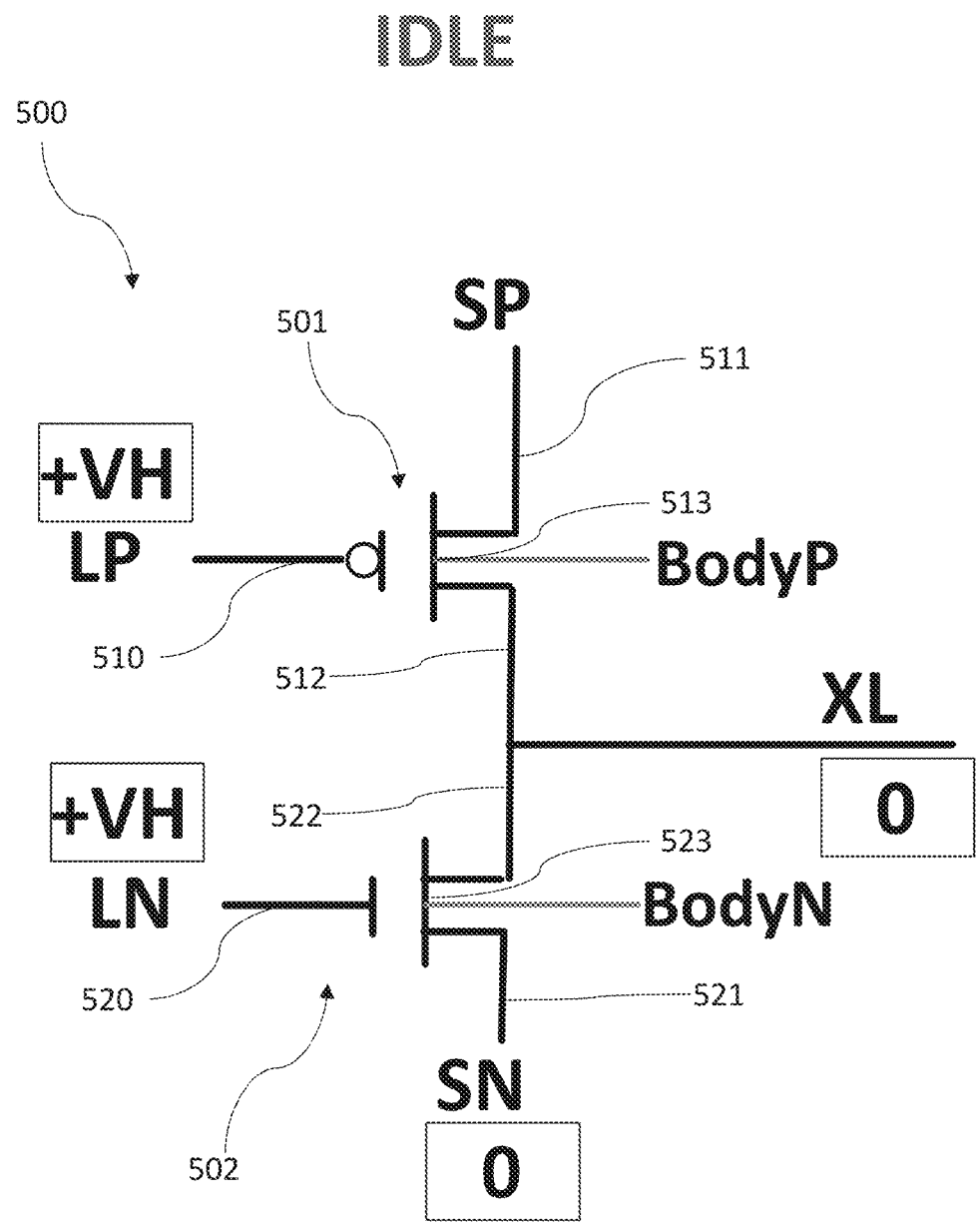
FIGS. 5A-5D show different operative conditions of the two-transistor driver according to the present disclosure.
Figure 5B:
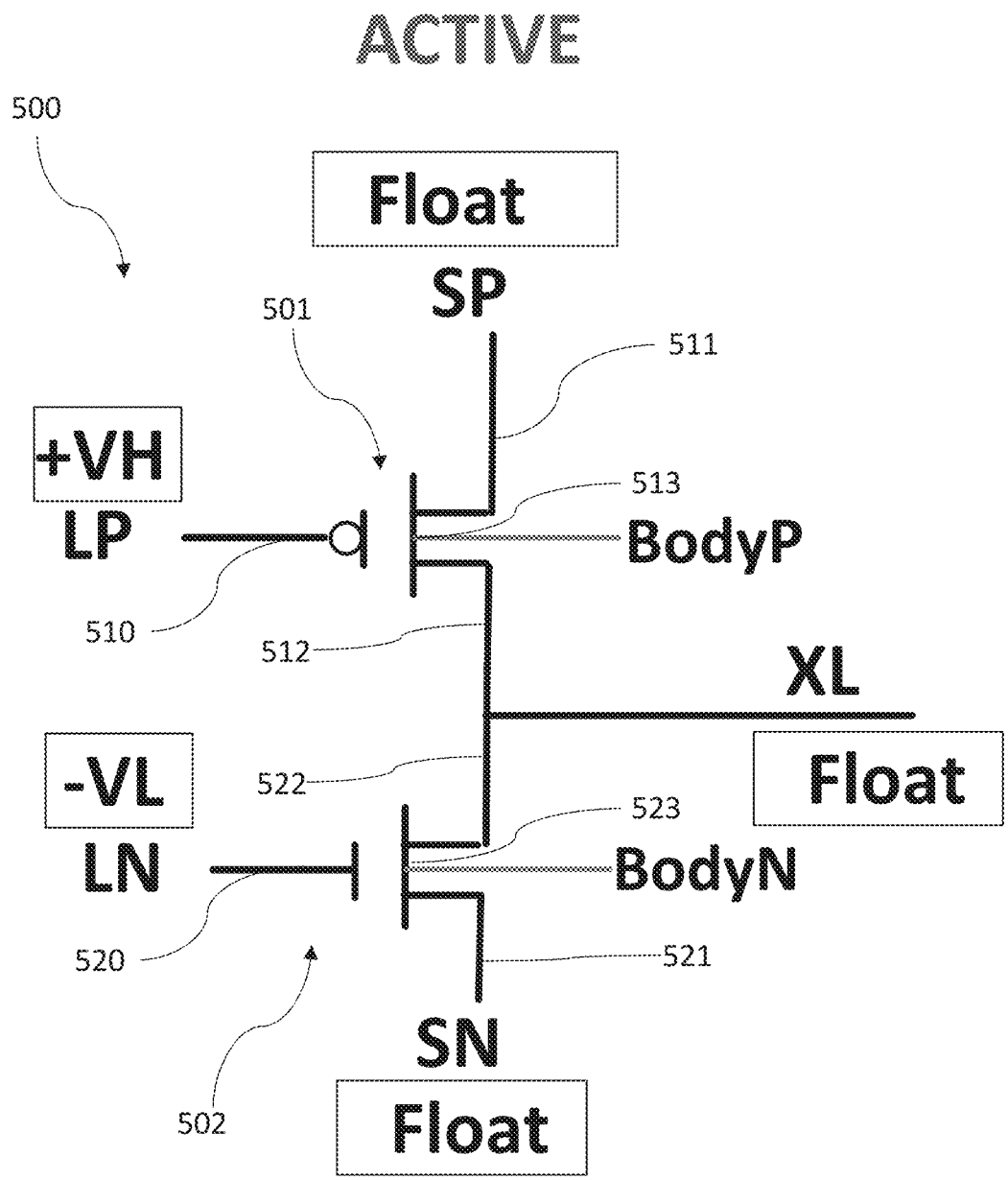
Figure 5C:
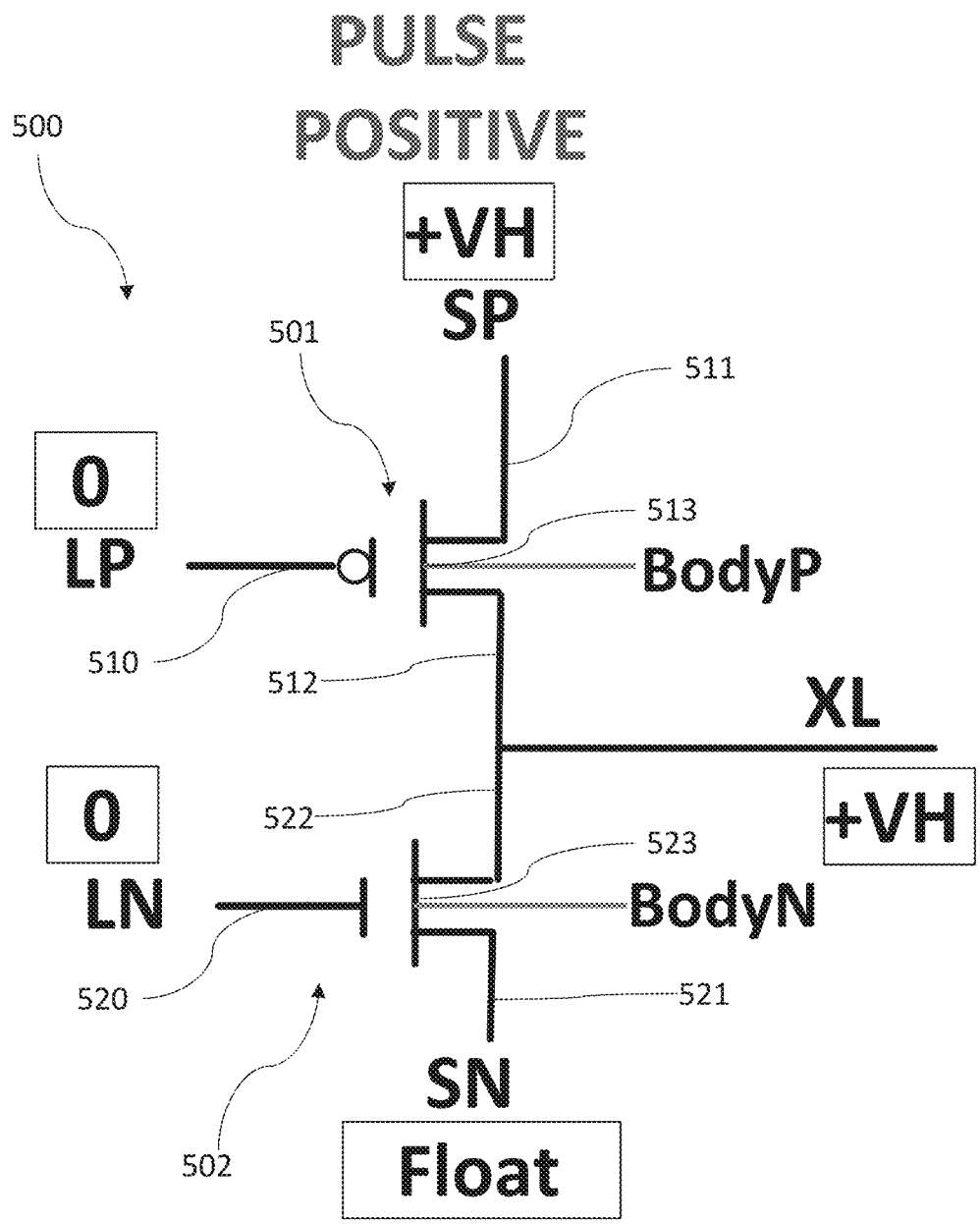

In other words, according to an embodiment of the present disclosure as shown in figures in the IDLE phase the gates of the P-type transistor and of the N-type transistor of driver 500 are at a positive voltage, such as the first read/program voltage +VH (which, in general, may also be any suitable inhibit gate voltage for P-type transistor 501 and any suitable pass-gate voltage for N-type transistor 502), in the ACTIVE phase the gate of the P-type transistor is at the first read/program voltage (which, in general, may also be any suitable inhibit gate voltage) and the gate of the N-type transistor is at the second read/program voltage, i.e. a negative voltage −VL (which, in general, may also be any suitable inhibit gate voltage), and in the PULSE phase the gates of the P-type transistor and of the N-type transistor are at the discharging voltage, e.g. ground voltage 0 (that is a pass/inhibit voltage during positive pulse and inhibit/pass during negative pulse, respectively, as it will be explained in detail below). In FIGS. 5A-5B, driver 500 may correspond to driver 400 of FIG. 4, transistor 501 may correspond to transistor 401 of FIG. 4, and transistor 502 may correspond to transistor 402 of FIG. 4. Any suitable pass gate voltage may be used in the IDLE phase for the N-type transistor, such as 1.5 V or 3.6 V (it may also be the positive read/program voltage, but the present disclosure is not limited to this value).

Figure 5D:
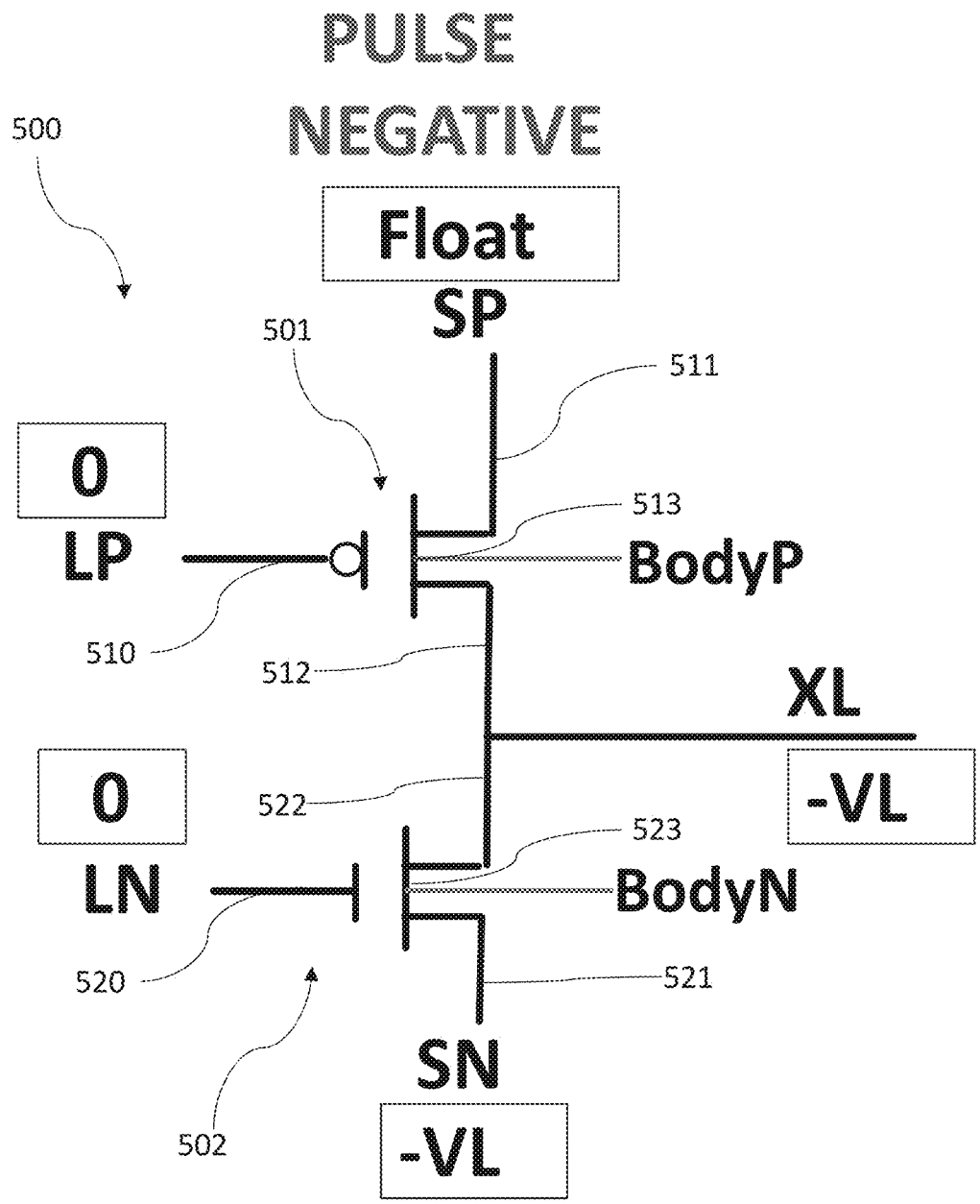

Moreover, in the IDLE phase, the source node of the N-type transistor is at the discharging voltage (so that such transistor is in a pass configuration), in the ACTIVE phase the source node of the N-type transistor is at the floating voltage, and in the PULSE phase the source node of the N-type transistor is at the second read/program voltage (pass configuration) or at the floating voltage based on the access operation of the cell coupled to said access line: for example, in case a negative voltage −VL has to be applied to the access line XL as in FIG. 5D, the source of the N-type transistor is at said negative voltage −VL. Furthermore, in the IDLE phase, the source node of P-type transistor may not be considered since the gate node of the N-type transistor is already biased at the positive voltage, in the ACTIVE phase the source node of the P-type transistor is at the floating voltage, and in the PULSE phase the source node of the P-type transistor is at the first read/program voltage (pass configuration) or at the floating voltage based on the access operation of the cell coupled to said access line: in case a positive voltage +VH has to be applied to the access line XL as in FIG. 5C, the source of the P-type transistor is at said positive voltage +VH.

In this way, according to the present disclosure, the P-type transistor 501 is configured to deliver the first read/program voltage (i.e. the positive voltage +VH) to the access line XL, and the N-type transistor 502 is configured to deliver the second read/program voltage (i.e. the negative voltage −VL) to the access line XL, thus optimizing the power consumption of the driver 500. For example, low-voltage transistors may be used, leading also to a lower area with respect to HV transistors. The N-type transistor 502 is also configured to deliver the discharge and the shielding voltages, that may be ground voltage in some examples.

Therefore, the driver 500 of the present disclosure is configured to operate in such a way that transistor's nodes are respectively biased to voltages with differences not exceeding reliability transistor rating during any of the IDLE, ACTIVE and PULSE phases. In other words, the voltage difference between, for example, the gate node and the drain node never exceed a maximum reliability rating for the transistor during any of the operative phases. Similarly, gate-to-body, gate-to-source, drain-to-body, drain-to-source and source-to-body voltage differences are within the respective maximum reliability ratings during each and all the operative phases, e.g., IDLE, ACTIVE and/or PULSE phase.

As described above, the driver of the present disclosure may drive an access line XL coupled to it to any desired voltage during any operation phase of memory device.

Figure 6:
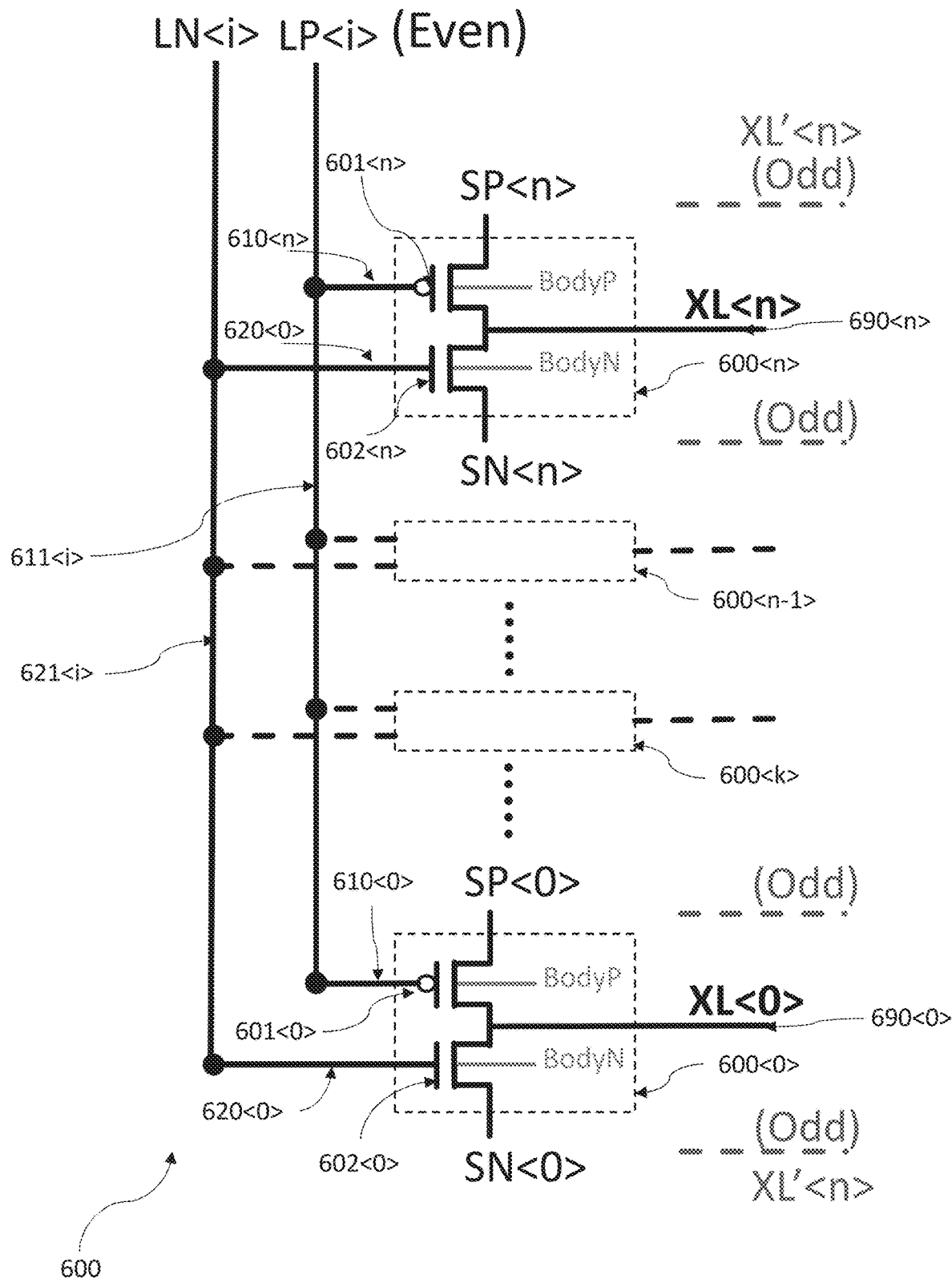
FIG. 6 illustrates an example of grouping two-transistor drivers in a memory device in accordance with embodiments of the present disclosure.

According to an embodiment, two-transistors drivers of the present disclosure may be grouped in groups to share one or more control signal lines, as depicted in FIG. 6, which illustrates an example of grouping drivers in a memory device in accordance with embodiments of the present disclosure.

More in particular, a plurality of N-type transistors 602<0>, . . . , 602<n> may be grouped in a group 600 sharing one or more control signal lines. In the figure, a single driver comprising one N-type transistor and one P-type transistor is indicated as 600<i> and is enclosed in a dashed box. Transistors 602<0>, . . . , 602<n> may be as transistor 402 of FIG. 4 and transistor 502 of FIGS. 5A-5D. In the depicted example, a first transistor 602<0> is configured to transfer the voltage provided by signal line SN<0> to access line 690<0>, herein referred to as XL<0>. A second transistor 602<n> is configured to transfer the voltage provided by signal line SN<n> to the access line 690<n>, herein referred to as XL<n>. Gate node 620<0> of the first transistor 602<0> and gate node 620<n> of the second transistor 602<n> may be coupled to each other and driven by a common control signal 621<i>, herein indicated also as LN<i> in the figure. Body nodes of respective transistors may be a common node BodyN, in some examples. Other drivers (not shown) may be coupled to the common control signal line LN<i>, that may be an even signal line (e.g., coupled to an even group 600 of drivers 600<0>, . . . , 600<n>, which may be any suitable number).

As mentioned before, P-type transistors may be grouped as seen for N-type transistors, so that gate nodes of the coupled transistors may be coupled to each other and driven by a common control signal line, so that the gates of the N-type and P-type transistors are coupled to respective group gate driving lines, as well as the sources thereof are coupled to respective source driving lines. More in particular, as shown in FIG. 6, a plurality of P-type transistors 601<0>, . . . , 601<n> may be grouped in the group 600 sharing one or more control signal lines. Transistors 601<0>, . . . , 601<n> may be as transistor 401 of FIG. 4 and transistor 501 of FIGS. 5A-5D. In the depicted example, a first transistor 601<0> is configured to transfer the voltage provided by signal line SP<0> to the access line 690<0> (i.e. access line XL<0>). A second transistor 601<n> is configured to transfer the voltage provided by signal line SP<n> to the access line 690<n> (i.e. access line XL<n>). Gate node 610<0> of the first transistor 601<0> and gate node 610<n> of the second transistor 601<n> may be coupled to each other and driven by a common control signal line 611<i>, indicated as LP<i> in FIG. 6. Body nodes of respective transistors may be a common node BodyP, in some examples. Other drivers (not shown) may be coupled to the common control signal line LP<i>, that may be an even signal line (e.g., coupled to an even group 600 of transistors 600<0>600<n>, which may be any suitable number). In other words, the various drivers 600<0>, . . . , 600<n> (each of them comprising one N-type transistor and one P-type transistor) may be grouped in the group 600 as indicated above.

Memory device 100 may comprise a plurality of even drivers organized in even groups 600, each driver 600<0>, . . . , 600<k>, . . . , 600<n−1>, 600<n> (which are represented in FIG. 6 with dashed line) coupled to a respective even access line (e.g. XL<0>, . . . , XL<n>), and a plurality of odd drivers (not shown) organized in odd groups, each driver coupled to a respective odd access line (e.g. XL'<0>, . . . , XL'<n>). In some examples, even and odd access lines may alternate in an array (such as array 102 of FIG. 1) of the memory device 100. With reference to FIGS. 6 and 1, an even access line (e.g. XL<0>, . . . , XL<n>) may be an example of word line WL_2 (or, alternatively, of digit line BL_2) and an odd access lines (e.g. XL'<0>, . . . , XL'<n>) may be an example of word line WL_1 (or, alternatively, of digit line BL_1) that is physically adjacent to the even access line. Even and odd access lines may be access lines in a same deck (e.g., lower deck 205 or upper deck 210 in FIG. 2) of the memory device 100 or 200. Two-transistor drivers of the present disclosure may be examples of word line drivers 312 and/or digit line drivers 312 of memory array 302, as described with reference to FIG. 3.

FIGS. 7 to 9A and 9B illustrate example configurations of two-transistor drivers during different phases of operation of the memory device. Two-transistor drivers may correspond to two-transistor drivers as disclosed with reference to FIGS. 4 and 5A-5D, and they may be grouped as illustrated with reference to FIG. 6, in some examples. As seen in FIG. 6, for the sake of simplicity, a single driver comprising one N-type transistor and one P-type transistor is indicated with a box.

Figure 7:
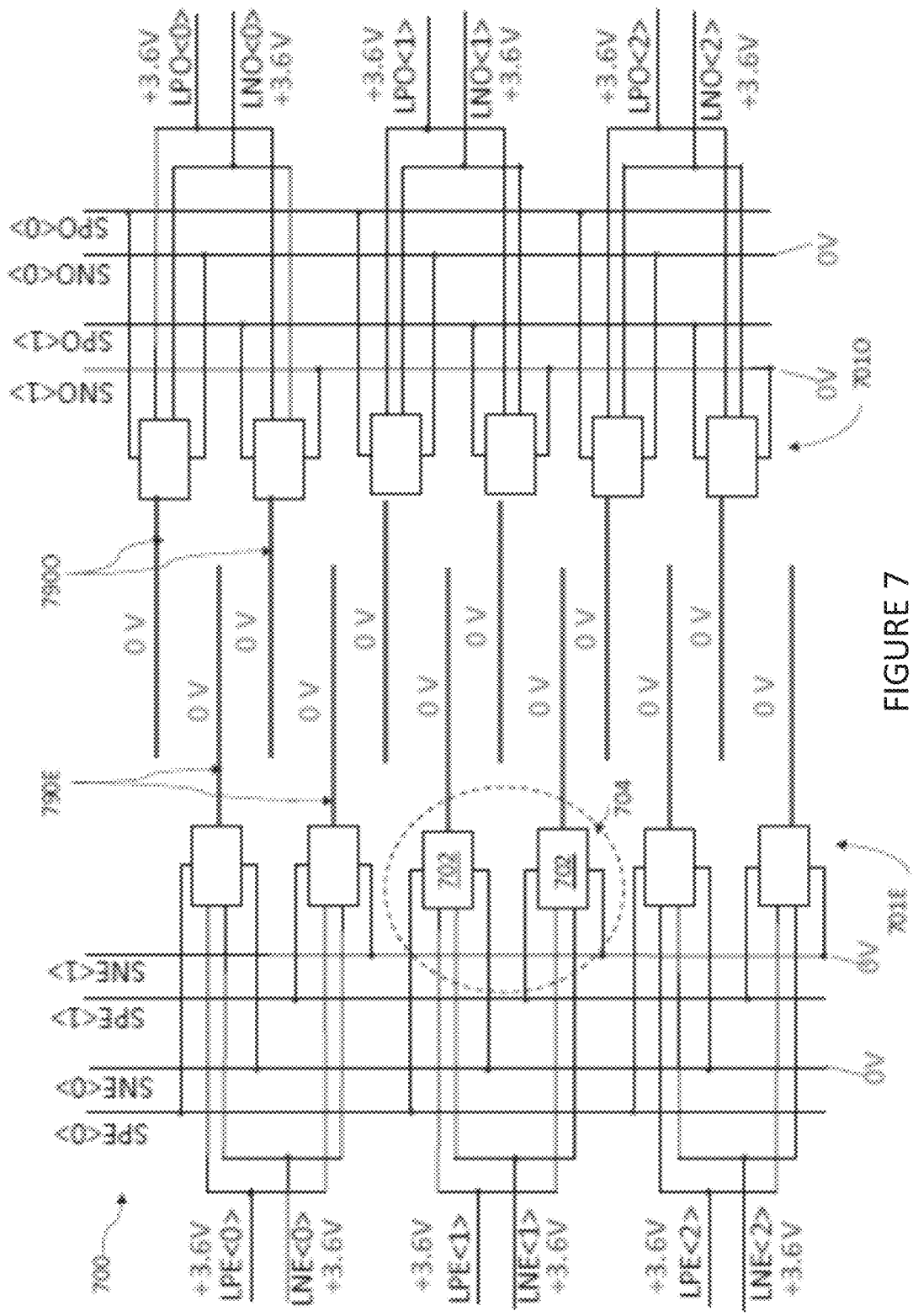
FIG. 7 illustrates an example configuration during an IDLE phase of a memory device that supports two-transistor drivers in accordance with embodiments of the present disclosure.

FIG. 7 illustrates an example configuration during an IDLE phase of a memory device that supports two-transistor drivers in accordance with embodiments of the present disclosure. A portion of a memory array 700, that may be an example of memory array 102, 200 and/or 302, comprises a plurality of even drivers 701E and a plurality of odd drivers 701O, each driver (globally indicated with reference 702) comprising one N-type transistor and one P-type transistor. Drivers 701E and 701O may be located under the memory array, in some examples. Despite even 701E and odd 701O drivers are depicted far apart from each other, in a similar fashion as drivers in different portions 312 and or 314 depicted in FIG. 3, in some embodiments, even 701E and odd 701O drivers may be arranged in a same driver region.

Each plurality of even/odd drivers may be organized in groups 704 of drivers 702, that may be examples of group 600 of drivers 600<1>, . . . , 600<n> as disclosed above with reference to FIG. 6.

According to an embodiment, gate nodes of the drivers are coupled to respective (even/odd) control signal lines, e.g. LNE and LPE for even transistors, and LPO and LNO for odd transistors. A number of drivers may be grouped, and respective gate nodes may be coupled to a same gate control signal line; for example, this is depicted for group 704 including a pair of drivers, the gate nodes of which are driven by signals lines LNE<1> and LPE<1>, that may correspond to common signal LN<i> and LP<i> for group 600 in FIG. 6. Clearly, different numbers of drivers may be grouped as described above.

According to an embodiment, source nodes of drivers are coupled to respective (even/odd) control signal lines e.g. SNE and SPE for even transistors, and SPO and SNO for odd transistors.

Each driver is then coupled to respective (even/odd) access line 790E and 790O, that may be examples of access lines 690<i> (i.e. XL<i>) and/or 110, 115 and/or 320, 330 in FIGS. 1, 3 and 6. Even 790E and odd 790O access lines may alternate, so that an even access line is always physically adjacent to an odd access line in a memory array deck, or vice-versa. Other arrangements are possible.

During the IDLE phase, the gate and source control signal lines may be biased as depicted in FIG. 7 and as disclosed above with reference to FIG. 5A. A discharging voltage, for example a ground voltage, may be applied to each and all access lines 790. The memory cells in the memory array are therefore subject to a null disturb and there is no consumption in the array. This desired result may be achieved by applying a positive gate voltage (e.g., the positive read/program voltage +VH, e.g. +3.6 V, even if other voltage values may be applied) to all the gate control signal lines LPE, LNE, LPO and LNO and by applying the discharge voltage, e.g. 0V, to the source control signal lines SNE and SNO of the N-type transistors. The body node voltage may be kept at a constant voltage of, for example, −3.6V. As seen before, in the IDLE phase any suitable inhibit/pass voltage may be used and the shown values are only nonlimiting examples of the present disclosure; for instance, a pass gate voltage of 1.5 V, as well as 3.6 V, or another suitable voltage, may be applied to the gate of the N-type transistor, so that it can transfer the discharging voltage to the access line.

Figure 8:
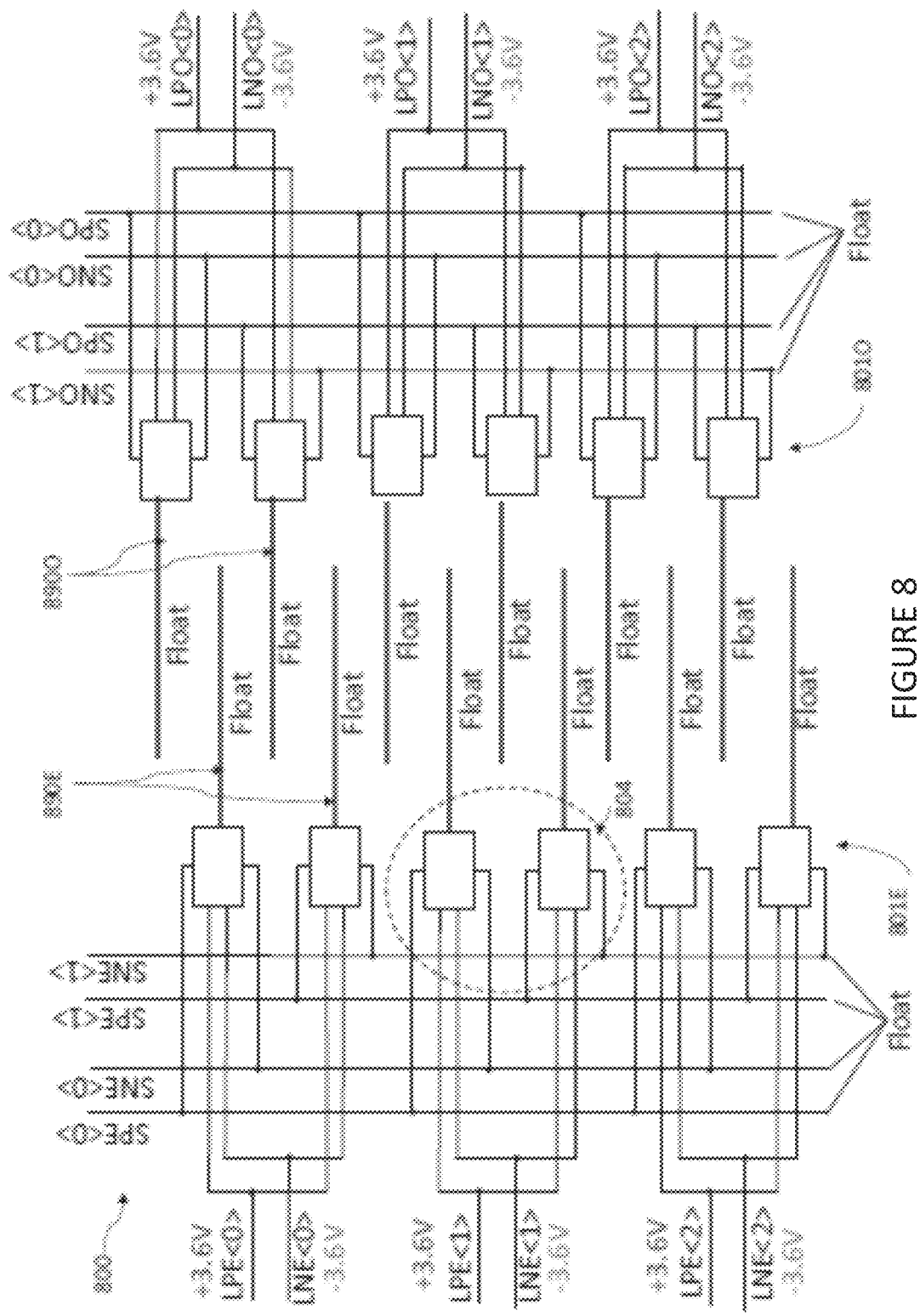
FIG. 8 schematically illustrates an example configuration during an ACTIVE phase of a memory device that supports two-transistor drivers in accordance with embodiments of the present disclosure.

FIG. 8 illustrates an example configuration during an ACTIVE phase of a memory device that supports two-transistor drivers in accordance with embodiments of the present disclosure. Elements in FIG. 8 correspond to equivalent elements in FIG. 7 and the description will not be repeated; it is noted that corresponding elements have the same label with first digit in the number aligned to the corresponding Figure number (e.g., access lines 790E and 790O in FIG. 7 are labeled 890E and 890O, respectively, in FIG. 8).

During the ACTIVE phase, the gate and source control signal lines may be biased as depicted in FIG. 5B and FIG. 8. A floating voltage, e.g., a not biased voltage, may be applied to each and all access lines 890E and 890O. The memory cells in the memory array are therefore subject to a null disturb and there is no consumption in the array. This desired result may be achieved by applying a negative voltage such as the negative read/program voltage −VL (e.g. −3.6 V, even if other suitable values may be used) to the gate control signal lines and LNE and LNO of the N-type transistor and by keeping floating the control signal lines SNE, SNO, SPE and SPO. The body node voltage may be kept at a constant voltage of, for example, −3.6V. In the ACTIVE phase, the gates of the P-type transistors LPE and LPO are set at a positive voltage (such as the read/program voltage +VH, e.g. +3.6V, even if other values may be used to obtain a suitable inhibit voltage). Therefore, any suitable inhibit voltage may be used in the ACTIVE phase; in general, the voltage applied to the gate of the N-type transistor is suitable to switch off said N-type transistor (it may be the second read/program voltage but the disclosure is not limited to this value).

Figure 9A:
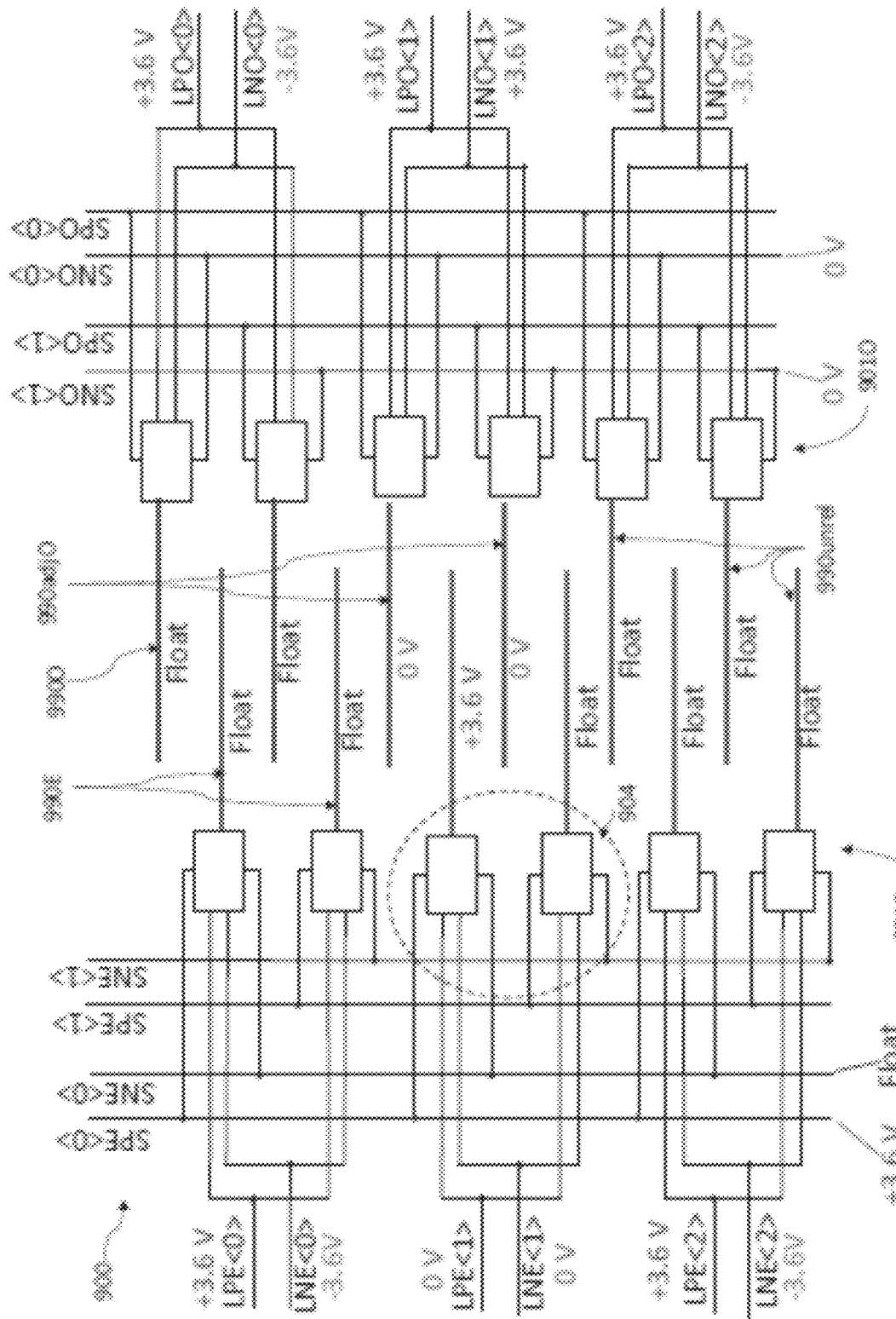
FIGS. 9A and 9B illustrate an example configuration during positive and negative read/program phase of a memory device that supports two-transistor drivers in accordance with embodiments of the present disclosure.

FIG. 9A illustrates an example configuration during a PULSE phase and more specifically during a positive read/program operation of a memory device that supports two-transistor drivers in accordance with embodiments of the present disclosure. Elements in FIG. 9A correspond to equivalent elements in FIGS. 7 and 8 and the description will not be repeated; the same label convention is adopted (e.g., with respect to corresponding elements).

During a PULSE phase, the gate and source control signal lines may be biased as depicted in FIG. 9A. Different biasing conditions are desired for the addressed access line and the unaddressed access lines, that in turn are not to be all biased to the same voltages. A positive read/program voltage, e.g. +3.6V, may be applied to an addressed access line by applying the discharging voltage (e.g. 0 V) to the gate control signal lines of the driver coupled to the line to be addresses, which control lines are referred to as LNE<1> and LPE<1> in FIG. 9A, and by applying the desired positive read/program voltage (e.g. +3.6V) to the proper source control signal line of the P-type transistor of such driver, i.e. SPE<0> in FIG. 9A. In this case, the source control signal line of the N-type transistor, i.e. SNE<0>, may be at the floating voltage. The driver coupled to the addressed access line may be in a group (e.g. group 904 which may be as group 704 of FIG. 7) and it may share some control signals with other drivers; for example, the gate control signal lines LPE<1> and LNE<1> are common with at least another driver in the group 904. The source control signal lines SNE<i> and SPE<i> may be coupled to source nodes of other drivers in different groups of the plurality of even drivers 901E (a same configuration may be adopted also for odd drivers 901O). This is only an exemplary architecture and many other architectures may be adopted according to the needs and/or circumstances.

A shielding voltage, e.g., a ground voltage, may be applied to one or more access line(s) 990adj physically adjacent to the addressed access line, i.e. address lines coupled to odd drivers 901O. This shielding voltage is applied by applying a positive voltage (such as the positive read/program voltage, e.g. +3.6V) to the gate control signal lines LPO<1> and LNO<1> of such drivers (which may be grouped together) and by applying the desired shielding voltage (e.g., 0V) to the source control signal lines of the N-type transistors, i.e. SNO<0> and SNO<1> in FIG. 9A. When the addressed access line has on both sides adjacent access lines 990adj coupled to drivers that are grouped together (e.g., both driven by same gate control signal lines LNO<1> and LPO<1>), as in the depicted example, it is sufficient to drive the common shared gate control signal lines to shield or ground both the adjacent access lines 990adj.

A floating voltage, e.g. an unbiased voltage, may be applied to one or more access line(s) grouped with the addressed access line in the same group 904 by maintaining the discharging voltage (e.g. 0 V) to the gate control signal line LNE<1> of the N-type transistor, and leaving the corresponding source line floating.

A floating voltage, e.g., an unbiased voltage, may be applied to one or more access line(s) 990unrel that are unrelated to the addressed access line; unrelated access lines 990unrel comprise access lines coupled to drivers in the plurality 901E in different groups than the addressed driver and/or access lines coupled to drivers in the plurality 901O in different groups than the driver(s) used to bias adjacent access lines to the shield voltage. The unrelated access lines 990unrel may be biased to the floating voltage by applying the proper signals to the gate control signal lines and to the source control signal lines of such drivers. More in particular, the gate control lines of the unrelated N-type transistors (e.g. LNE<0>, LNE<2>, LNO<0>, LNO<2> in FIG. 9A) are biased at a negative voltage (such as −VL, e.g. −3.6V) and the gate control lines of the unrelated P-type transistors (e.g. LPE<0>, LPE<2>, LPO<0>, LPO<2> in FIG. 9A) are biased at a positive voltage (such as −VH, e.g. +3.6V). The corresponding source nodes are either biased to maintain the proper voltage to the addressed access line or may not be considered.

Figure 9B:
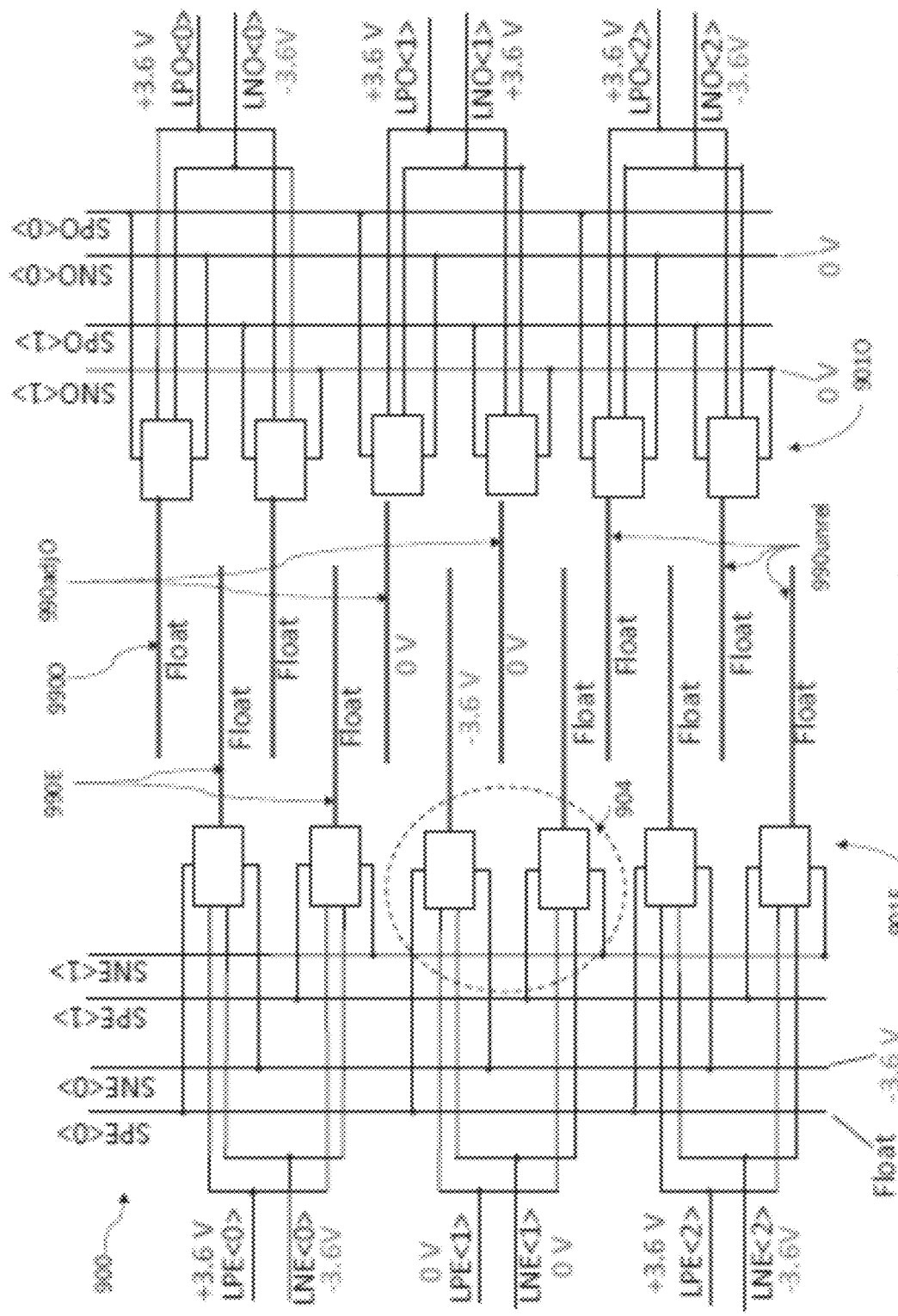

As shown in FIG. 9B a negative read/program voltage, e.g. −3.6V, may be applied to an addressed access line (which may be the same access line of FIG. 9A) by applying the discharging voltage (e.g. 0 V) to the gate control signal lines of the driver coupled to the line to be addresses, which gate control signal lines are referred to as LNE<1> and LPE<1>, and by applying the desired negative read/program voltage (e.g. −3.6V) to the proper source control signal line, i.e. SNE<0> in FIG. 9B. In this case, the source control signal line of the P-type transistor, i.e. SPE<0> in FIG. 9B, is at the floating voltage. The driver coupled to the addressed access line may be in group 904 and it may share some control signals with other drivers, as shown in FIG. 9A.

A shielding voltage, e.g., a ground voltage, may be applied to one or more access line(s) (e.g. to odd adjacent access lines 990*adjO*) as already shown in FIG. 9A. Moreover, a floating voltage, e.g. an unbiased voltage, may be applied to one or more access line(s) 990*unrel* that are unrelated to the addressed access line as shown in FIG. 9A.

In all phases, the body node voltage may be kept at a constant voltage. Different voltage values for control signals, body and access lines may be used without departing from the scope of the invention. As mentioned before, the shown voltage values are only nonlimiting examples.

Therefore, according to the present disclosure, a first even two-transistor driver is configured to drive a first even access line to the discharging voltage during the IDLE phase, to drive the first even access line to the floating voltage during the ACTIVE phase, and to drive the first even access line to the read/program voltage during the PULSE phase, and a first odd two-transistor driver is configured to drive a first odd access line to the discharging voltage during the IDLE phase, to drive the first odd access line to the floating voltage during the ACTIVE phase, and to drive the odd access line to a shielding voltage during the PULSE phase, wherein the first odd access line is physically adjacent to the first even access line.

According to an embodiment of the present disclosure, the first even two-transistor driver comprises a first even P-type transistor and a first even N-type transistor with gates coupled to respective even group gate driving lines, and sources coupled to respective first even source driving lines, and the first odd two-transistor driver comprises a first odd P-type transistor and a first odd N-type transistor with gates coupled to respective odd group gate driving lines, and sources coupled to respective first odd source driving lines. A second even two-transistor driver comprises a second even P-type transistor and a second even N-type transistor with gates coupled to said respective even group gate driving lines, and sources coupled to respective second even source driving lines, the second even two-transistor driver being configured to drive a second even access line to the discharging voltage during the IDLE phase, to drive the second even access line to the floating voltage during the ACTIVE phase, and to drive the second even access line to the shielding voltage during the PULSE phase. A second odd two-transistor driver comprises a second odd P-type transistor and a second odd N-type transistor with gates coupled to said respective odd group gate driving lines, and sources coupled to respective second odd source driving lines, the second odd two-transistor driver being configured to drive a second odd access line to the discharging voltage during the IDLE phase, to drive the second odd access line to the floating voltage during the ACTIVE phase, and to drive the second odd access line to the shielding voltage during the PULSE phase, wherein the second odd access line is physically adjacent to the first even access line.

According to an embodiment of the present disclosure, the first even two-transistor driver comprises a first even P-type transistor and a first even N-type transistor with gates coupled to respective even group gate driving lines, and sources coupled to respective first even source driving lines, and the first odd two-transistor driver comprises a first odd P-type transistor and a first odd N-type transistor with gates coupled to respective odd group gate driving lines, and sources coupled to respective first odd source driving lines. A second even two-transistor driver comprises a second even P-type transistor and a second even N-type transistor with gates coupled to said respective even group gate driving lines, and sources coupled to respective second even source driving lines, the second even two-transistor driver being configured to drive a second even access line to the discharging voltage during the IDLE phase, to drive the second even access line to the floating voltage during the ACTIVE phase, and to drive the second even access line to the shielding voltage during the PULSE phase. A second odd two-transistor driver comprises a second odd P-type transistor and a second odd N-type transistor with gates coupled to respective second odd group gate driving lines different from said respective odd group gate driving lines, and sources coupled to respective second odd source driving lines, the second odd two-transistor driver being configured to drive a second odd access line to the discharging voltage during the IDLE phase, to drive the second odd access line to the floating voltage during the ACTIVE phase, and to drive the second odd access line to the shielding voltage during the PULSE phase, wherein the second odd access line physically adjacent to the first even access line.

According to an embodiment, a plurality of even two-transistor drivers is organized in even groups, each driver being coupled to a respective even access line, the first even two-transistor driver being in a first group of the plurality of even two-transistor drivers, as well as a plurality of odd two-transistor drivers is organized in odd groups, each driver being coupled to a respective odd access line, the first odd two-transistor driver being in a first group of the plurality of odd two-transistor drivers, wherein respective even access lines and respective odd access lines alternate in a deck of the memory device. According to a particular embodiment, the first even access line is physically adjacent to a respective odd access line coupled to a second odd two-transistor driver in the first group of the plurality of odd two-transistor drivers, or the first even access line is physically adjacent to a respective odd access line coupled to a second odd two-transistor driver in a second group of the plurality of odd two-transistor drivers.

According to an embodiment, the memory device may comprise a second group of the plurality of even two-transistor drivers and a second group of the plurality of odd two-transistor drivers, the second groups of even and odd two-transistor drivers being configured to drive the respective even and odd access lines to the floating voltage during an ACTIVE phase and during the PULSE phase of the first even access line.

Advantageously, it is possible to switch from the ACTIVE phase to the PULSE phase by selecting a specific group of the plurality of groups, wherein selecting the specific group comprises driving the gates of said specific group to the discharging voltage, the remaining groups being in the ACTIVE state. This leads to a reduced consumption, as only the desired group can be easily controlled.

According to an embodiment, the memory device may comprise a further two-transistor driver configured to drive an orthogonal access line, substantially perpendicular to the first even access line, to the discharging voltage during the IDLE phase, to drive the orthogonal access line to the floating voltage during the ACTIVE phase, and to drive the orthogonal access line to a orthogonal read/program voltage during the PULSE phase.

Operation of the memory device is now described in terms of a phase diagram and methods to operate the memory device.

Figure 10:
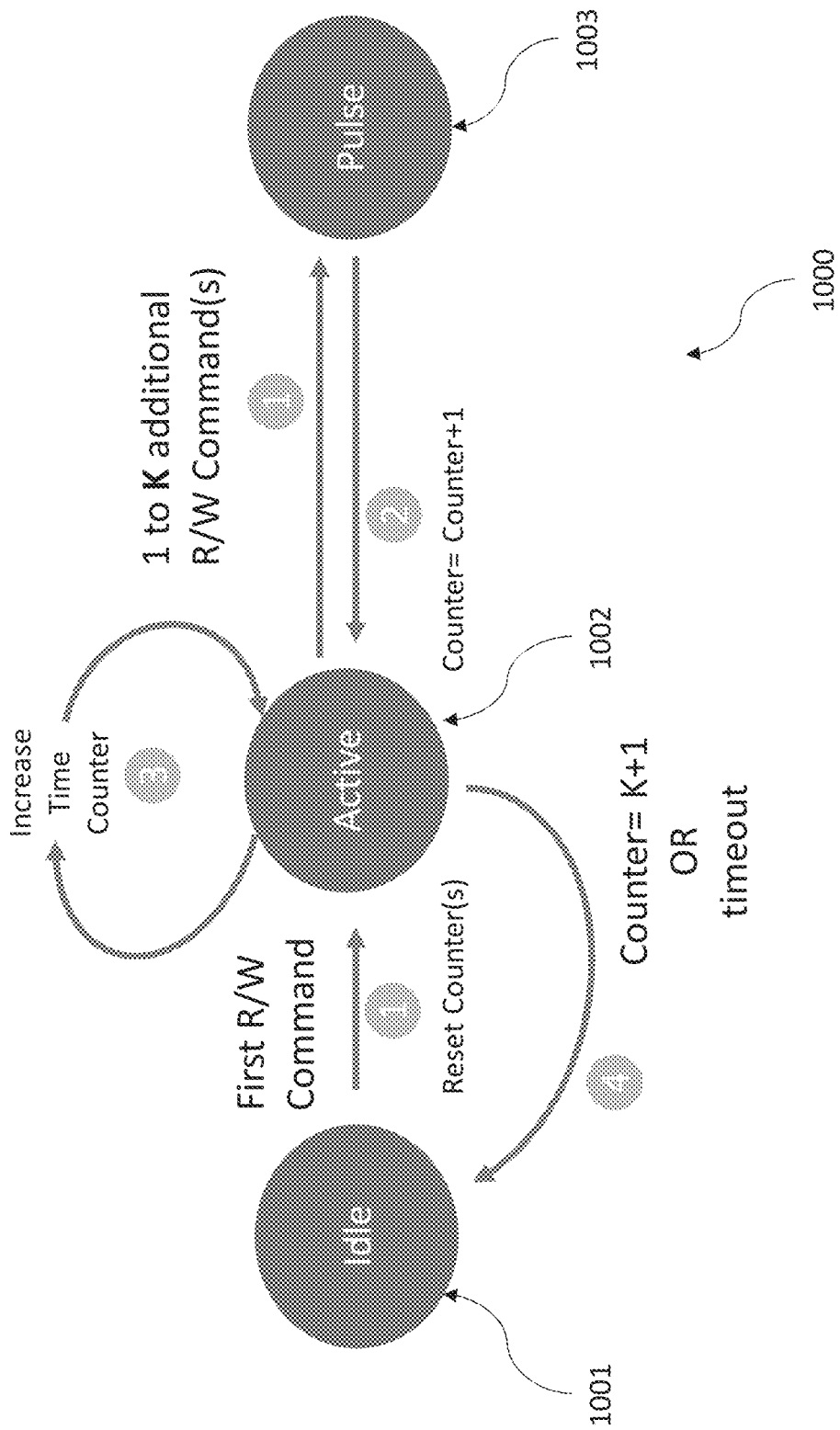
FIG. 10 illustrates a phase diagram of a memory device that supports the two-transistor drivers in accordance with embodiments of the present disclosure.

FIG. 10 illustrates a phase diagram of a memory device that supports two-transistor drivers in accordance with embodiments of the present disclosure. Phase diagram 1000 comprises an IDLE phase 1001, an ACTIVE phase 1002 and a PULSE phase 1003; other phases (not shown) may be present.

IDLE phase 1001 may be a phase during which the memory device is in a low consumption state, for example a standby state. A command, for example an access command such as a read or a program command, may be received during IDLE phase 1001 for execution by the memory device; other commands may be received during the IDLE phase. During IDLE phase 1001 it is desirable that all access lines in the memory array (for example access lines 110 and 115, 320 and 330, 790-990, with reference to FIGS. 1-9) are kept at a discharge voltage, such as a ground voltage, for example. This desired result may be obtained by controlling the two-transistor drivers as described above, for example with reference to FIG. 7.

ACTIVE phase 1002 may be a phase during which the memory device is ready to receive and/or execute a command; for example, an access command such as a read or a program command, may be received during ACTIVE phase 1002 for execution by the memory device. Other commands may be received during the ACTIVE phase. During ACTIVE phase 1002 it is desirable that all access lines in the memory array are kept at a floating voltage; all access lines may by insulated and unbiased, for example. This desired result may be obtained by controlling two-transistor drivers as described above with reference to FIG. 8, for example.

PULSE phase 1003 may be a phase during which the memory device executes a command; for example, an access command such as a read or a program command. During PULSE phase 1003 the desired read/program voltage (e.g., +3.6V or −3.6V) may be applied to the target or addressed access line and access lines physically adjacent to the addressed access line may be biased to a shielding voltage (e.g., a ground voltage); moreover, it is also desirable that unrelated access lines are kept to a floating state. This desired result may be obtained by controlling two-transistor drivers as described above. It should be noted any particular read/program pulse shape may be used; for example, ramped pulses, or staircase pulses, or pulses with different polarities and/or different voltage values may be applied during the PULSE phase.

As described in FIG. 10, transitions from the different phases may occur. For example, when the memory device is in an IDLE phase, a transition from the IDLE phase 1001 to the ACTIVE phase 1002 may occur based on receiving a command, such as First R/W Command, that may be an access (e.g., read/program) command. This transition from IDLE to ACTIVE phases is indicated as 1 in FIG. 10. As a result of IDLE to ACTIVE transition 1, all access lines, initially grounded, are floated. Additionally, based on IDLE to ACTIVE phases transitioning 1, an access counter is reset and a timer is started. The access counter is a counter configured to store a number of access operations in the memory device or in a portion of the memory device, such as a bank, a partition, a tile, a page, etc., for example. Multiple counters may be present, each counter associated to a respective portion of the memory device (bank, partition, tile, page, etc.), in some embodiments. All counters may be reset on IDLE to ACTIVE transition 1. The timer may track time lapsed from last IDLE to ACTIVE transition time to present time, in some embodiments.

After IDLE to ACTIVE transition 1, the memory device is in ACTIVE phase. To complete execution of the received command, after IDLE to ACTIVE transition 1, ACTIVE to PULSE transition, also indicated as 1 in FIG. 10, may take place. As a result of the ACTIVE to PULSE transition 1, the target or addressed line is coupled to the read/program pulse generation circuitry, the access lines physically adjacent to the addressed access line or grouped to it are coupled to the shield voltage generation circuitry and the unrelated access lines are kept floating. As explained below, ACTIVE to PULSE transition 1 is allowed up to a count threshold (for example up to K read/program operations) or until lapsing of a time period, as determined by the timer.

After the ACTIVE to PULSE transition 1, the memory device in the PULSE phase and the read/program pulse may be applied to execute the command. Based on completion of applying the read/program pulse, the addressed access line may be grounded and a PULSE to ACTIVE transition 2 may take place. As a result of PULSE to ACTIVE transition 2 all access lines in the array are floated. Based on ACTIVE to PULSE transition 1, the relevant access counter (e.g., the sole counter and/or the counter associated to the addressed bank, partition, tile, page, etc.) is increased.

While in the ACTIVE phase 1002, for example waiting for a new read/program command, the timer is updated (e.g., a time-driven counter is increased). This ACTIVE to ACTIVE transition is indicated as 3 in FIG. 11. While in ACTIVE phase 1002, it may be checked whether the access counter has or has not exceed an access threshold (e.g., K access operations to the relevant memory portion). If the check results in the access counter meeting or exceeding the threshold, ACTIVE to IDLE transition, indicated with 4 in FIG. 10, is carried out. While in ACTIVE phase 1002, it may be checked whether the timer has or has not exceed a time threshold (e.g., a predefined period has lapsed since last IDLE to ACTIVE transition 1). If the check results in the access counter meeting or exceeding the threshold, ACTIVE to IDLE transition 4 is carried out. One or both of the check on access counter and the check on timer may take place; they are individually or in combination intended to avoid that the memory device stays in the ACTIVE phase after an excessively high number of access operations or for too long a time period, that might each or in combination induce possible voltage drift on otherwise floating access lines. As a result of the ACTIVE to IDLE transition 4, all the access lines in the memory array are biased to a discharge voltage (for example a ground voltage), therefore periodically refreshing a safe biasing condition of the array.

While in the ACTIVE phase 1002, a new command may be received, for example an access command such as a read/program command. Based on receiving a command, ACTIVE to PULSE transition 1 may directly take place and the read/program pulse may be applied as described above.

In all cases, PULSE phase 1003 (and corresponding read/program pulse) is entered from ACTIVE phase 1002 characterized by all access lines being floating. Accordingly, a considerable energy saving is obtained since it is not necessary to charge nor discharge unaddressed access lines, with the only exception of access lines adjacent to the addressed access line, that are biased to a shielding voltage (e.g., ground or 0V) to avoid disturbs induced on floating lines. Memory device normally may be in IDLE phase 1001 when no commands are received or are not received for a predefined time period and it may be in ACTIVE phase 1002 until the time period lapses after last IDLE to ACTIVE transition 1 occurred and/or a threshold value of access counts is met or exceeded.

Figure 11:
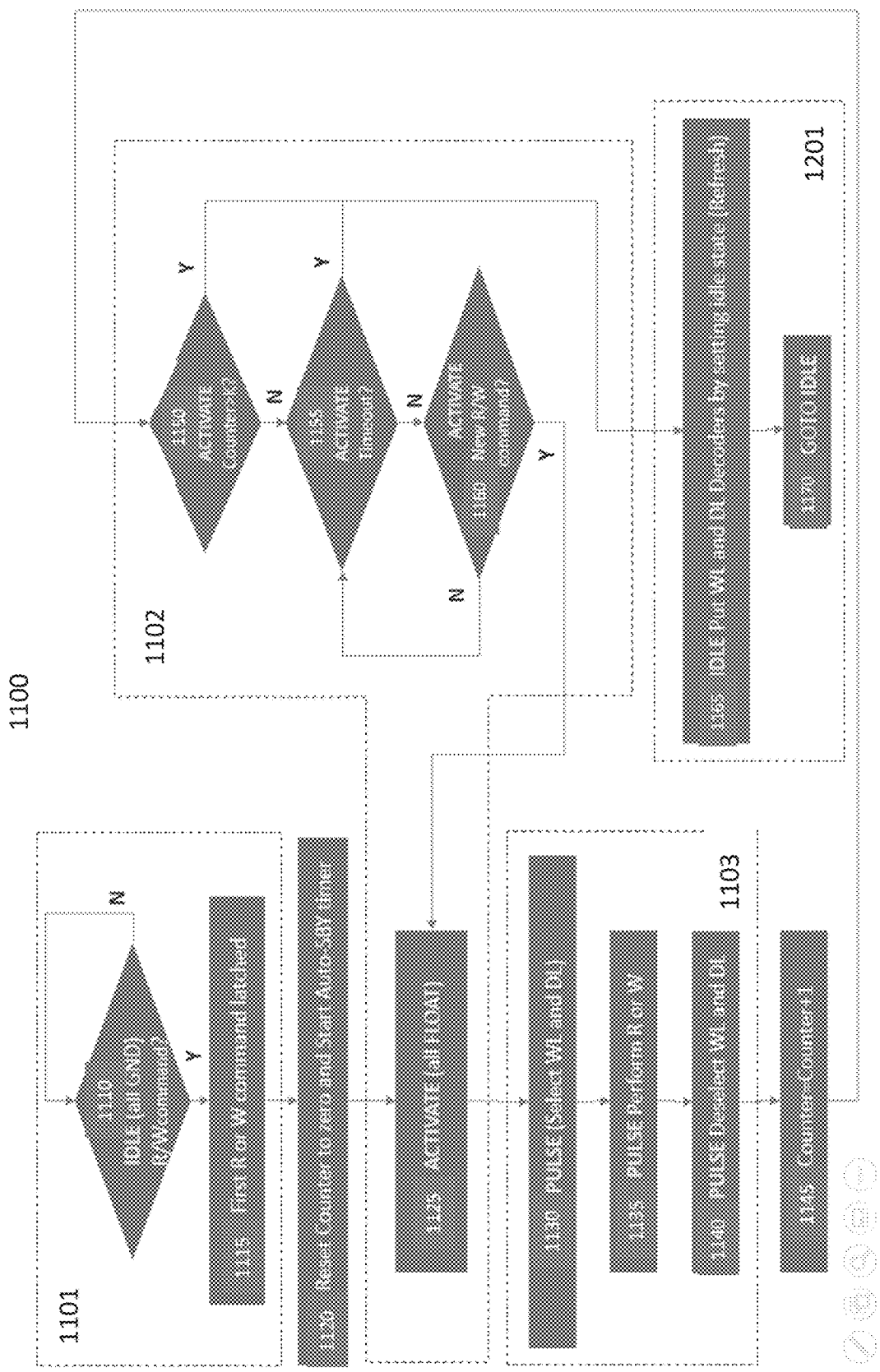
FIG. 11 illustrates a flow diagram of a method according to the present disclosure.

FIG. 11 illustrates a flow diagram of a method for a memory device that supports two-transistor drivers in accordance with embodiments of the present disclosure. Method 1100 comprises a number of steps that have been grouped, in the representation of FIG. 12, in IDLE phase 1201, ACTIVE phase 1102 and PULSE phase 1103, as well as other steps that may be carried out during transitions from one to another of the phases above. Method 1100 may comprise other phases and/or steps (not shown). Method 1100 may be implemented by a memory device 100 using two-transistor driver 400 as described with reference to FIG. 4, for example, and possibly configured to operate according to the description of phase diagram described in FIG. 10, in some examples.

Method 1100 may start at step 1110 when the memory device in an IDLE phase 1101 with all access lines grounded and waits for an access command (e.g., a read/program R/W command). Memory device stays at step 1110 (branch N) until the command is received and latched, at step 1115.

At step 1125 memory device is in an ACTIVE phase 1102 with all access lines floating and, based on the received R/W command, method 1200 continues to step 1130 when access lines (e.g., word lines and digit lines) are selected during a PULSE phase 1103. At step 1135 the Read or Program is performed (e.g., the read or program pulse is applied to the addressed access line(s)) and at step 1140 word line WL and digit line DL are deselected (e.g., the addressed access lines are grounded and then all access lines, including access lines adjacent to or grouped with the addressed access line are floated).

Method 1100 may continue at step 1145 when an access counter is increased. Memory device may return to the ACTIVE phase 1102 at step 1150 when the access counter is checked against a threshold. If the counter meets or exceeds the threshold (branch Y), method 1100 may continue at step 1165; if, on the contrary, the threshold is not met nor exceeded (branch N), a timeout check is carried out at step 1155 (e.g., by using a timer measuring time lapsed since last IDLE to ACTIVE transition). In case of timeout (branch Y), method 1100 continues at step 1165; in case of no timeout (branch N) memory device waits for a new command to be received at step 1160, iterating (branch) through timeout check at 1155 and command reception at 1160 until an exit condition is met. When a command, that may be an access command such as a read/program command, is received (branch Y of 1360), method 1100 continues at steps 1125 and 1130 already described above (leading to application of the read/program pulse during a PULSE phase 1103 and return to the ACTIVE phase 1102).

When method 1100 reaches step 1165 (for example because access counter meets or exceeds the threshold at step 1150, branch Y, or in case of timeout at step 1155, branch Y) word line WL and digit line DL decoders are configured to bias all access lines to a discharge voltage (e.g., a ground voltage) as it is the case during an IDLE phase 1101. Step 1170 simply reconnects the diagram in FIG. 11 to starting step 1110.

Figure 12:
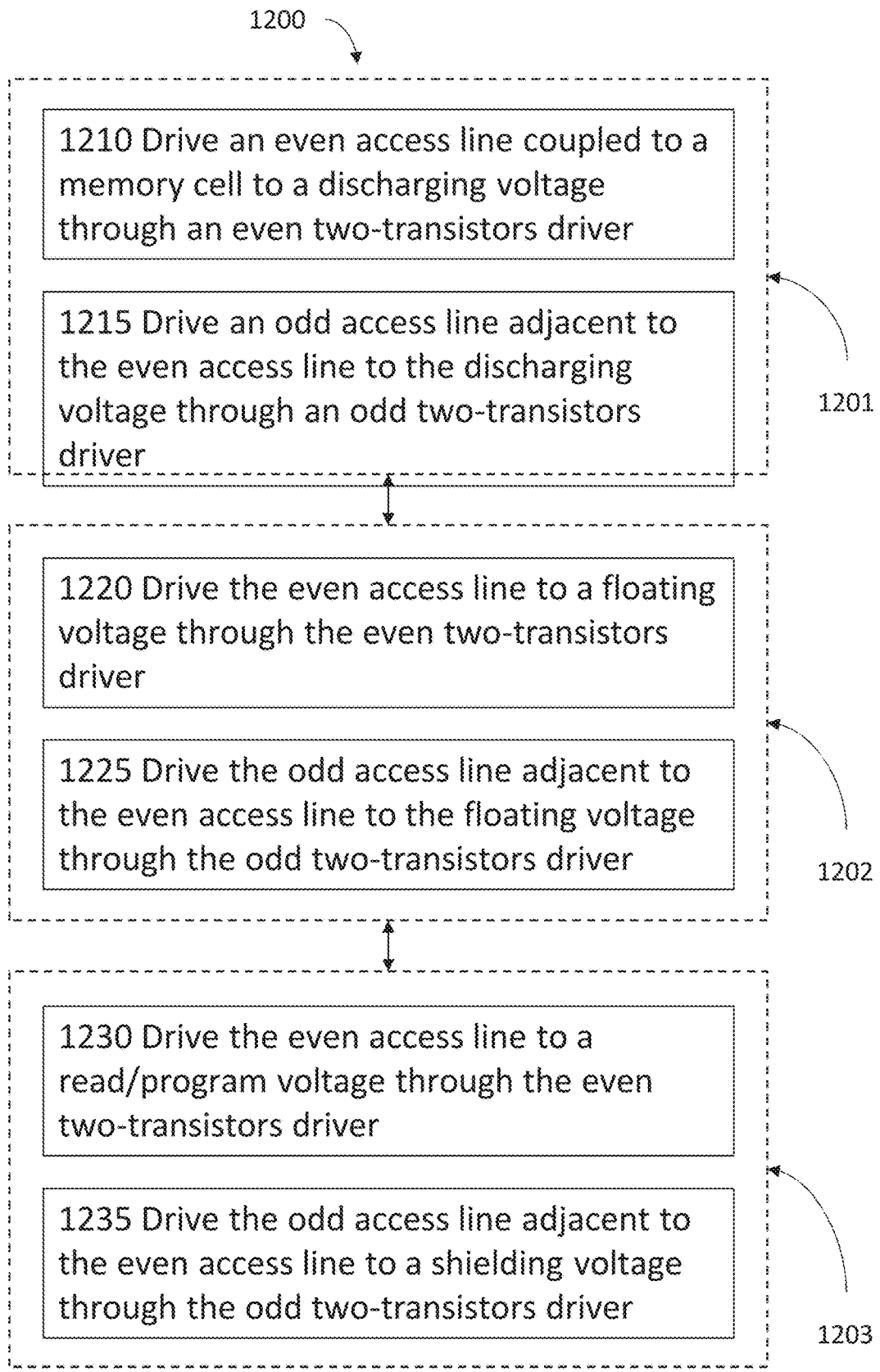
FIG. 12 illustrates a block diagram of steps of a method according to the present disclosure.

FIG. 12 illustrates a block diagram of a method for a memory device that supports two-transistor drivers in accordance with embodiments of the present disclosure. Method 1200 comprises some steps, e.g., steps 1210 and 1215, that may be associated with an IDLE phase 1201, some steps, e.g., steps 1220 and 1225, that may be associated with an ACTIVE phase 1202, some steps, e.g., steps 1230 and 1235, that may be associated with a PULSE phase 1203. IDLE 1201, ACTIVE 1202, and PULSE 1203 phases may be examples of IDLE 1001, 1101, ACTIVE 1002, 1102, and PULSE 1003, 1103 phases described with reference to FIGS. 10 and 11 and or IDLE, ACTIVE and PULSE phases respectively described in FIGS. 7-9. Method 1200 may be implemented in a memory device, such as memory device 100 of FIG. 1, in some embodiments. In some examples, method 1200 may rely on two-transistor drivers such the driver 400 of FIG. 4; in some embodiments, two-transistor drivers may be grouped in groups 600, as described above with reference to FIG. 6, for example.

Method 1200 may comprise, at step 1210, driving an even access line coupled to a memory cell to a discharging voltage through an even two-transistor driver. In some embodiments, the discharging voltage may be a ground voltage, for example it may be 0V.

Method 1200 may comprise, at step 1215, driving an odd access line adjacent to the even access line to the discharging voltage through an odd two-transistor driver. In some embodiments additional access lines (e.g., more access lines other than the even access line and the odd access line adjacent to the even access line) may be driven to the discharging voltage through respective drivers. In some cases, all the access lines of the memory array may be discharged, or grounded, for example during an IDLE phase 1201.

Method 1200 may comprise, at step 1220, driving the even access line to a floating voltage through the even two-transistor driver. In some embodiments, the floating voltage may be an unbiased voltage, for example the floating voltage may substantially remain unchanged until a biasing voltage is applied.

Method 1200 may comprise, at step 1225, driving the odd access line adjacent to the even access line to the floating voltage through the odd two-transistor driver. In some embodiments additional access lines (e.g., more access lines other than the even access line and the odd access line adjacent to the even access line) may be driven to the floating voltage through respective drivers. In some cases, all the access lines of the memory array may be floated, for example during an ACTIVE phase 1202.

Method 1200 may comprise, at step 1230, driving the even access line to a read/program voltage through the even two-transistor driver. In some embodiments, the read/program voltage may be a positive read/program voltage (for example +3.6V). In some embodiments, the read/program voltage may be a negative read/program voltage (for example −3.6V).

Method 1200 may comprise, at step 1235, driving the odd access line adjacent to the even access line to a shielding voltage through the odd two-transistor driver. In some embodiments, the shielding voltage may be a ground voltage, for example it may be 0V. In some embodiments, other access lines grouped with the even access line may be driven to the shielding voltage through respective drivers and/or other access lines that are unrelated to the (addressed) even access line may be driven to the floating voltage through respective drivers, for example during a PULSE phase 1203.

In some embodiments, method 1200 may further comprise (not illustrated in flow diagram of FIG. 12) selectively providing the discharge voltage, the read/write voltage and/or the shield voltage to the even and odd two-transistor drivers through source driving lines coupled to respective source nodes of respective transistors (both P-type and N-type) in the drivers. Additionally, method 1200 may further comprise selectively providing gate control signals to the even and odd drivers through gate driving lines coupled to respective gate nodes of respective transistors in the drivers. In some cases, selectively providing the gate control signals comprises providing the gate control signals in parallel to a group of even or odd drivers and selectively providing the discharge voltage, the read/write voltage and/or the shield voltage comprises providing each of the discharge voltage, the read/write voltage and/or the shield voltage, in parallel to a plurality of even or odd drivers in different groups.

In some embodiments, method 1200 comprises providing the discharge voltage to access line(s) through a N-type transistor. Method 1200 may also comprise providing shielding voltages to unaddressed access line(s) through a N-type transistor. Method 1200 may also comprise providing negative read/program voltages to addressed access line(s) through a N-type transistor. Method 1200 may also comprise providing positive read/program voltages to addressed access line(s) through a P-type transistor. Providing the discharge voltage, the read/write voltage and/or the shield voltage, and providing the gate control signals may comprise biasing transistor nodes to voltage differences not exceeding reliability transistor rating during any of the IDLE, ACTIVE and PULSE phases.

In some embodiments, method 1200 may comprise receiving an access command, that may be one of a read or a write command to a memory portion of the array (e.g., a bank, a partition, a tile, a page, etc., or the memory array as a whole), and, if in the IDLE phase, transitioning the memory portion from the IDLE phase to the ACTIVE phase based on receiving the read or the write command, and then transitioning the memory portion from the ACTIVE phase to the PULSE phase, if in the ACTIVE phase, transitioning the memory portion from the ACTIVE phase to the PULSE phase based on receiving the read or the write command, executing the PULSE phase in the memory portion, increasing a read/program counter and returning the memory portion to the ACTIVE phase based on the executing, and maintaining the memory portion in the ACTIVE phase based on the read/program counter and/or a time counter not meeting respective threshold, or returning the memory portion to the IDLE phase based on the read/program counter or the time counter meeting respective threshold.

In method 1200, returning the memory portion to the ACTIVE phase based on the executing may comprise driving the even access line to the discharge voltage after driving the even access line to the read/program voltage. Additionally or alternatively, transitioning the memory portion from the IDLE phase to the ACTIVE phase may further comprise resetting the read/program counter and/or the time counter.

Figure 13:
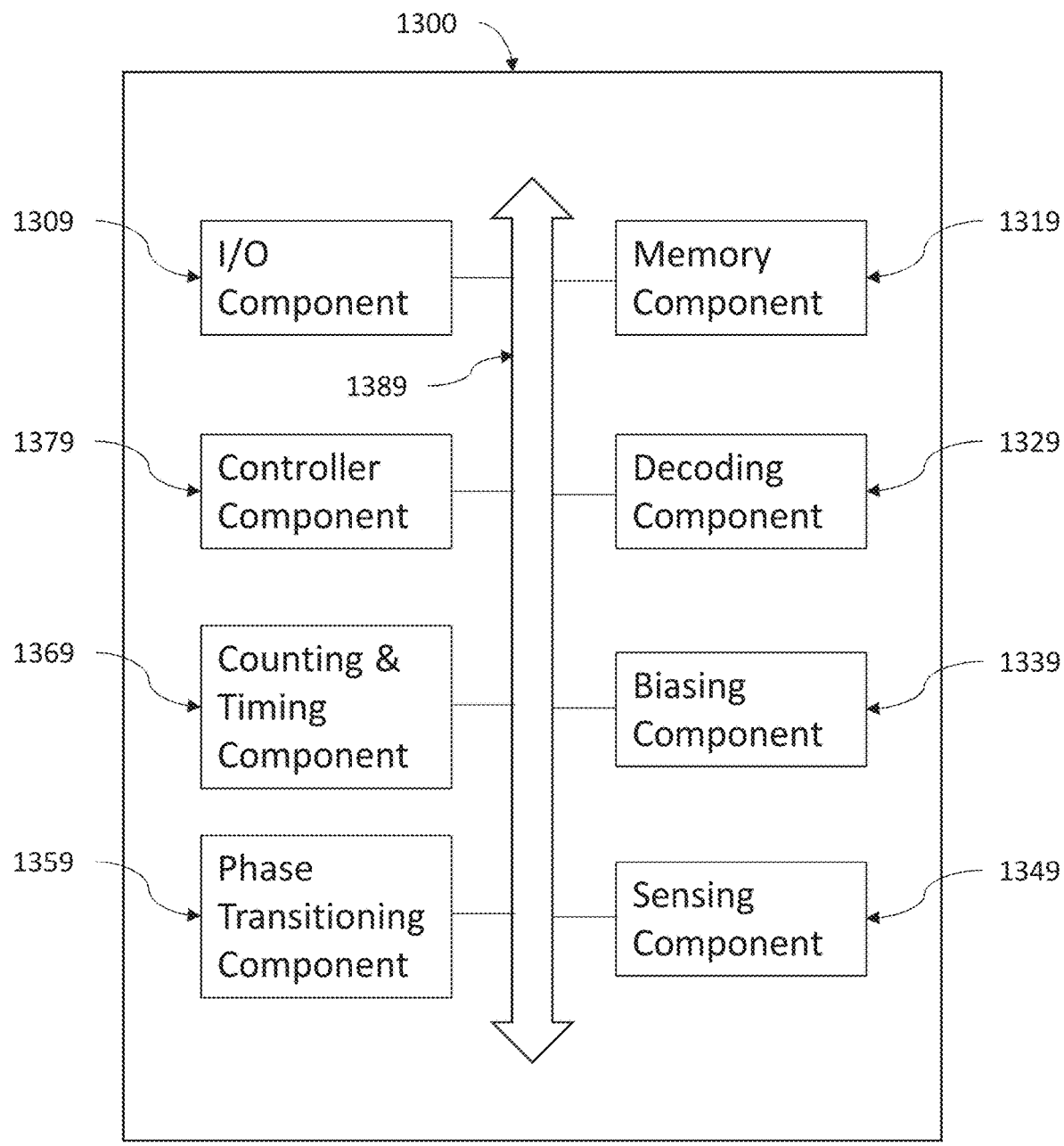
FIG. 13 illustrates a block diagram of a memory device that supports the two-transistor drivers in accordance with embodiments of the present disclosure.

FIG. 13 illustrates a block diagram of a memory device 1300 that supports two-transistor drivers in accordance with embodiments of the present disclosure. Memory device 1300 may be an example of memory device 100, as described with reference to FIG. 1, in some embodiments. Memory device 1300 may be configured to implement methods 1100 and 1200 described above. In some embodiments, device 1300 may be configured to operate in some phases, such as an IDLE phase, an ACTIVE phase and a PULSE phase, among others, as described with reference to FIG. 11.

Memory device 1300 may comprise an Input/Output (I/O) component 1309, a memory component 1319, a decoding component 1329, a biasing component 1339, a sensing component 1349, a phase transitioning component 1359, a counting & timing component 1369 and a controller component 1379, among other components (not shown). The various components 1309-1379 may be coupled to each other through bus 1389.

I/O component 1309 may receive from and/or send to an external media manager (not shown) commands, addresses and/or data. For example, I/O component may receive an access command, such as a read or a program command, to access one or more memory cells in a memory array (e.g., memory cells in memory component 1319). I/O component may also receive memory cell address of the memory cell(s) to be accessed and, for example in case of a program command, data to be written to the memory cell(s). In another example, I/O component may transmit to the external media manager data retrieved from memory cells in the memory array as result of a read command previously received.

Memory component 1319 may comprise a memory array, for example one embodiment of memory array described above with reference to FIGS. 1-3. Memory component 1319 may also comprise decoders (e.g., row and column decoders) with access line drivers, for example two-transistor drivers 400 as described above with reference to FIG. 4. The drivers may be organized and operated as described above with reference to FIGS. 5-12.

Memory device 1300 may comprise decoding component 1329, that in some cases may be included in memory component 1319. Based on a memory cell address, decoding component 1329 may select access lines, e.g., word line(s) and digit line(s) coupled to the addressed memory cell(s) for biasing by biasing component 1339. Biasing component 1339, responsive to the command received by memory device 1300 and/or to a phase or state of the memory device 1300, may generate voltages to discharge, shield and/or read/program the memory cells in memory component 1319. Sensing component 1349 may sense memory cells in memory component 1319 and make a determination about one or more logic states stored therein.

Memory device 1300 may comprise phase transitioning component 1359, that may cooperate with other component in memory device 1300 to modify the device state, e.g., to transition from an IDLE to an ACTIVE phase, from an ACTIVE phase to a PULSE phase, from a PULSE phase to an ACTIVE phase and/or from an ACTIVE phase to an IDLE phase, for example, as described above. Counting & timing component 1369 may track the number of accesses to any memory portion in memory component 1319; for example the number of read and/or program operations from/into a bank, a partition, a tile, a page, etc., or the memory array as a whole. The number of accesses may be stored in a counter and used to determine whether the access count meets or exceeds a threshold. Counting & timing component 1369 may track time lapsed after a last IDLE to ACTIVE transition to determine a possible timeout. Based on either or both the access counter and timeout determinations, an ACTIVE to IDLE phase transition may be triggered by the phase transitioning component 1359. Returning to the IDLE phase after the threshold number of access operations or after the allowed time lapse effectively discharges, or grounds, the access lines as described above on a periodic or usage base and any possible actual voltage drift of access lines is limited or avoided.

Memory device 1300 may also comprise controller component 1379, that oversees global operation of memory device 1300 and, in particular, provides control signals and biasing voltages to the drivers of access lines of the memory array.

Memory device 1300 may be an example of a system or may be a subsystem of a system comprising a memory array and a controller configured to drive an even access line coupled to a memory cell to a discharging voltage through an even driver, and to drive an odd access line adjacent to the even access line to the discharging voltage through an odd driver, during an IDLE phase, the controller also configured to drive the even access line to a floating voltage through the even driver, and drive the odd access line adjacent to the even access line to the floating voltage through the odd driver, during an ACTIVE phase, and the controller also configured to drive the even access line to a read/program voltage through the even driver, and drive the odd access line adjacent to the even access line to a shielding voltage through the odd driver, during a PULSE phase. These and other operating conditions have been described in detail above with reference to FIGS. 1-12.

The components of the device 1300 may include circuitry designed to carry out their functions. This may include various circuit elements, for example, conductive lines, transistors, capacitors, inductors, resistors, amplifiers, or other active or inactive elements, configured to carry out the functions described herein. The device 1300 may be a computer, a server, a laptop computer, a notebook computer, a tablet computer, a mobile phone, a wearable electronic device, a personal electronic device, or the like. The device 1300 may also be a portion or element of such a device.

In conclusion, the present disclosure provides a decoder driver for a memory device comprising a P-type transistor and N-type transistor and operating in four modes (i.e. IDLE phase, ACTIVE phase, and PULSE phase in turn comprising positive selection and negative selection). The decoder is low power, has improved reliability and may have thin oxide. According to the present disclosure, the decoder refresh is based on time or access operation, thus avoiding leakages.

Driver functionality is therefore split in idle vs active, wherein in IDLE mode the lines are kept to the discharge voltage and in ACTIVE mode lines are floating except a small given number of even/odd driver packets. Lines may be shielded by keeping these packets in IDLE mode. The packet may be selected by the given selected address (one line selected and two adjacent lines not selected. Array lines are then refreshed (i.e. returning in IDLE phase) from time to time or based on the per-partition access counter.

Advantageously according to the present disclosure, the proposed driver does not require overdrive, so that oxide and junction voltage are low, which may lead to tighter design (e.g. 70A oxide). The decoder is highly reliable and may allow for 8 bit per Tile programming (e.g. four couples of bits staggered in time).

More in particular, according to the present disclosure, and exemplary memory device comprises memory cells at cross points of access lines of a memory array, and a two-transistor driver comprising a P-type transistor and a N-type transistor connected to the P-type transistor, the two-transistor driver being configured to drive an access line of the memory array to a discharging voltage during an IDLE phase, to drive said access line to a floating voltage during an ACTIVE phase, and to drive said access line at least to a first or second read/program voltage during a PULSE phase.

Moreover, according to the present disclosure, an exemplary system comprises a memory array and a controller, the controller being configured to drive an even access line coupled to a memory cell to a discharging voltage through an even two-transistor driver comprising a P-type transistor and a N-type transistor, and to drive an odd access line adjacent to the even access line to the discharging voltage through an odd two-transistor driver comprising a P-type transistor and a N-type transistor, during an IDLE phase. The controller is further configured to drive the even access line to a floating voltage through the even two-transistor driver, and drive the odd access line adjacent to the even access line to the floating voltage through the odd two-transistor driver, during an ACTIVE phase. The controller is further configured to drive the even access line to a read/program voltage through the even two-transistor driver, and drive the odd access line adjacent to the even access line to a shielding voltage through the odd two-transistor driver, during a PULSE phase. The array of memory cells may comprise a Self-Selecting Memory (SSM) or a 3D cross point (3D X Point) memory.

Moreover, according to the present disclosure, an exemplary method to operate a memory device having a two-transistor driver comprising a P-type transistor and a N-type transistor connected to P-type transistor comprises the steps of, during an IDLE phase, driving an access line coupled to a memory cell to a discharging voltage through the two-transistor driver, during an ACTIVE phase, driving said access line to a floating voltage through the two-transistor driver, and, during a PULSE phase, driving said access line at least to a first or second read/program voltage through the two-transistor driver.

Moreover, according to the present disclosure, an exemplary method to operate a memory device having at least one even two-transistor driver comprising a P-type transistor and a N-type transistor and at least one odd two-transistor driver comprising a P-type transistor and a N-type transistor comprises the steps of, during an IDLE phase, driving an even access line coupled to a memory cell to a discharging voltage through the even two-transistor driver, and driving an odd access line adjacent to the even access line to the discharging voltage through the odd two-transistor driver, during an ACTIVE phase, driving the even access line to a floating voltage through the even two-transistor driver, and driving the odd access line adjacent to the even access line to the floating voltage through the odd two-transistor driver, and during a PULSE phase, driving the even access line to a read/program voltage through the even two-transistor driver, and driving the odd access line adjacent to the even access line to a shielding voltage through the odd two-transistor driver.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "terminal" need not suggest a physical boundary or connection point of a circuit element. Rather, "terminal" may refer to a reference point of a circuit relevant to the circuit element, which may also be referred to as a "node" or "reference point."

The devices discussed herein, including memory device 100, array 200, and circuitry 300, and drivers described with reference to FIGS. 1-9 may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A memory device comprising:
   memory cells at cross points of access lines of a memory array; and
   a two-transistor driver comprising a P-type transistor and a N-type transistor connected to the P-type transistor, the two-transistor driver being configured to drive an access line of the memory array to a discharging voltage during an IDLE phase, to drive said access line to a floating voltage during an ACTIVE phase, and to drive said access line to a first or second read/program voltage during a PULSE phase.

2. The memory device of claim 1, wherein the two-transistors driver is configured so that:
   in the IDLE phase gates of the P-type transistor and of the N-type transistor are at a respective inhibit gate voltage for the P-type Transistor and pass gate voltage for the N-type transistor, in the ACTIVE phase the gate of the P-type transistor is at an inhibit gate voltage and the gate of the N-type transistor is at an inhibit gate voltage, and in the PULSE phase the gates of the P-type transistor and of the N-type transistor are at the discharging voltage;
   in the IDLE phase a source node of the N-type transistor is at the discharging voltage, in the ACTIVE phase the source node of the N-type transistor is at the floating voltage, and in the PULSE phase the source node of the N-type transistor is at the second read/program voltage or at the floating voltage based on an access operation to a cell coupled to said access line; and
   in the ACTIVE phase a source node of the P-type transistor is at the floating voltage, and in the PULSE phase the source node of the P-type transistor is at the first read/program voltage or at the floating voltage based on the access operation to the cell coupled to said access line.

3. The memory device of claim 1, comprising:
   a first even two-transistor driver configured to drive a first even access line to the discharging voltage during the IDLE phase, to drive the first even access line to the floating voltage during the ACTIVE phase, and to drive the first even access line to the read/program voltage during the PULSE phase; and
   a first odd two-transistor driver configured to drive a first odd access line to the discharging voltage during the IDLE phase, to drive the first odd access line to the floating voltage during the ACTIVE phase, and to drive the first odd access line to a shielding voltage during the PULSE phase,
   wherein the first odd access line is physically adjacent to the first even access line.

4. The memory device of claim 3, wherein:
   the first even two-transistor driver comprises a first even P-type transistor and a first even N-type transistor with gates coupled to respective even group gate driving lines, and sources coupled to respective first even source driving lines, and
   the first odd two-transistor driver comprises a first odd P-type transistor and a first odd N-type transistor with gates coupled to respective odd group gate driving lines, and sources coupled to respective first odd source driving lines,
   the memory device further comprising:
   a second even two-transistor driver comprising a second even P-type transistor and a second even N-type transistor with gates coupled to said respective even group gate driving lines, and sources coupled to respective second even source driving lines, the second even two-transistor driver being configured to drive a second even access line to the discharging voltage during the IDLE phase, to drive the second even access line to the floating voltage during the ACTIVE phase, and to drive the second even access line to the shielding voltage during the PULSE phase; and a second odd two-transistor driver comprising a second odd P-type transistor and a second odd N-type transistor with gates coupled to said respective odd group gate driving lines, and sources coupled to respective second odd source driving lines, the second odd two-transistor driver being configured to drive a second odd access line to the discharging voltage during the IDLE phase, to drive the second odd access line to the floating voltage during the ACTIVE phase, and to drive the second odd access line to the shielding voltage during the PULSE phase, wherein the second odd access line is physically adjacent to the first even access line.

5. The memory device of claim 3, wherein:
the first even two-transistor driver comprises a first even P-type transistor and a first even N-type transistor with gates coupled to respective even group gate driving lines, and
sources coupled to respective first even source driving lines, the first odd two-transistor driver comprises a first odd P-type transistor and a first odd N-type transistor with gates coupled to respective odd group gate driving lines, and sources coupled to respective first odd source driving lines,
the memory device further comprising:
a second even two-transistor driver comprising a second even P-type transistor and a second even N-type transistor with gates coupled to said respective even group gate driving lines, and sources coupled to respective second even source driving lines, the second even two-transistor driver being configured to drive a second even access line to the discharging voltage during the IDLE phase, to drive the second even access line to the floating voltage during the ACTIVE phase, and to drive the second even access line to the shielding voltage during the PULSE phase; and
a second odd two-transistor driver comprising a second odd P-type transistor and a second odd N-type transistor with gates coupled to respective second odd group gate driving lines different from said respective odd group gate driving lines, and sources coupled to respective second odd source driving lines, the second odd two-transistor driver being configured to drive a second odd access line to the discharging voltage during the IDLE phase, to drive the second odd access line to the floating voltage during the ACTIVE phase, and to drive the second odd access line to the shielding voltage during the PULSE phase,
wherein the second odd access line physically adjacent to the first even access line.

6. The memory device of claim 3, comprising:
a plurality of even two-transistor drivers organized in even groups, each driver being coupled to a respective even access line, the first even two-transistor driver being in a first group of the plurality of even two-transistor drivers; and
a plurality of odd two-transistor drivers organized in odd groups, each driver being coupled to a respective odd access line, the first odd two-transistor driver being in a first group of the plurality of odd two-transistor drivers,
wherein respective even access lines and respective odd access lines alternate in a deck of the memory device.

7. The memory device of claim 6, wherein:
the first even access line is physically adjacent to a respective odd access line coupled to a second odd two-transistor driver in the first group of the plurality of odd two-transistor drivers, or
the first even access line is physically adjacent to a respective odd access line coupled to a second odd two-transistor driver in a second group of the plurality of odd two-transistor drivers.

8. The memory device of claim 6, comprising a controller configured to switch from the ACTIVE phase to the PULSE phase by selecting a specific group of the plurality of groups, wherein selecting the specific group comprises driving the gates of said specific group to the discharging voltage, the remaining groups being in the ACTIVE state.

9. The memory device of claim 6, further comprising a second group of the plurality of even two-transistor drivers and a second group of the plurality of odd two-transistor drivers, the second groups of even and odd two-transistor drivers being configured to drive the respective even and odd access lines to the floating voltage during an ACTIVE phase and during the PULSE phase of the first even access line.

10. The memory device of claim 3, wherein the discharging voltage and the shielding voltage are a ground voltage, and wherein the first read/program voltage is a positive voltage and the second read/program voltage is a negative voltage having a same magnitude as the first read/program voltage.

11. The memory device of claim 1 comprising a further two-transistor driver configured to drive an orthogonal access line, substantially perpendicular to the access line, to the discharging voltage during the IDLE phase, to drive the orthogonal access line to the floating voltage during the ACTIVE phase, and to drive the orthogonal access line to an orthogonal read/program voltage during the PULSE phase.

12. The memory device of claim 11, wherein the orthogonal read/program voltage has an opposite polarity than a polarity of the first or second read/program voltage.

13. The memory device of claim 1, wherein the transistors are selected from CMOS transistors, FinFET transistors, or vertical TFT transistors.

14. The memory device of claim 1, wherein the array of memory cells comprises a Self-Selecting Memory (SSM) or a 3D cross point (3D X Point) memory.

15. The memory device of claim 1, further comprising a read/program counter, a time counter, and a controller configured to:
implement a transition from the IDLE phase to the ACTIVE phase based on reception of a read or a write command, and then implement transition from the ACTIVE phase to the PULSE phase, or
implement a transition from the ACTIVE phase to the PULSE phase upon reception of a read or write command;
return to the ACTIVE phase upon completion of the read/program phase; and
remain in the ACTIVE phase if the read/program counter and the time counter are below respective threshold, or return to IDLE phase if the read/program counter or the time counter meet respective threshold.

16. A method to operate a memory device having a two-transistor driver comprising a P-type transistor and a N-type transistor connected to the P-type transistor, the method comprising:

during an IDLE phase, driving an access line coupled to a memory cell to a discharging voltage through the two-transistor driver;

during an ACTIVE phase, driving said access line to a floating voltage through the two-transistor driver; and during a PULSE phase, driving said access line to a first or second read/program voltage through the two-transistor driver.

17. The method of claim 16, comprising:
during the IDLE phase:
   driving an even access line coupled to the memory cell to the discharging voltage through an even two-transistor driver, and
   driving an odd access line adjacent to the even access line to the discharging voltage through an odd two-transistor driver;
during the ACTIVE phase:
   driving the even access line to the floating voltage through the even two-transistor driver, and
   driving the odd access line adjacent to the even access line to the floating voltage through the odd two-transistor driver; and
during a PULSE phase:
   driving the even access line to the read/program voltage through the even two-transistor driver, and
   driving the odd access line adjacent to the even access line to a shielding voltage through the odd two-transistor driver.

18. The method of claim 17, further comprising, during the PULSE phase of the even access line, driving another access line adjacent to the even access line to the shielding voltage through a respective two-transistor driver coupled to said another access line.

19. The method of claim 17, further comprising, during the PULSE phase of the even access line, driving another access line not adjacent to the even access line to the floating voltage through a respective two-transistor driver coupled to said another access line.

20. The method of claim 17, further comprising:
selectively providing the discharge voltage, the read/program voltage and/or the shielding voltage to the even and odd two-transistor drivers through source driving lines coupled to respective source nodes of respective transistors in the drivers.

21. The method of claim 20, further comprising selectively providing gate control signals to the even and odd two-transistor drivers through respective gate driving lines coupled to respective gate nodes of respective transistors in the drivers.

22. The method of claim 21, wherein:
selectively providing the gate control signals comprises providing the gate control signals in parallel to a group of even or odd two-transistor drivers, and
selectively providing the discharge voltage, the read/program voltage and/or the shielding voltage comprises providing each of the discharge voltage, the read/program voltage and/or the shielding voltage, in parallel to a plurality of even or odd two-transistor drivers in different groups,
the method further comprising switching from the ACTIVE phase to the PULSE phase by selecting a specific group of two-transistor drivers, wherein selecting the specific group comprises driving the gates of said specific group to the discharging voltage, the remaining groups being in the ACTIVE state.

23. The method of claim 17, wherein the discharging voltage and the shielding voltage are a ground voltage, and the read/program voltage is one of a positive voltage and a negative voltage.

24. The method of claim 16 further comprising:
receiving a read or a write command to a memory cell in a memory portion;
if in the IDLE phase, transitioning the memory portion from the IDLE phase to the ACTIVE phase based on receiving the read or the write command, and then transitioning from the ACTIVE phase to the PULSE phase;
if in the ACTIVE phase, transitioning the memory portion from the ACTIVE phase to the PULSE phase based on receiving the read or the write command;
executing the PULSE phase in the memory portion, increasing a read/program counter and returning the memory portion to the ACTIVE phase based on the executing; and
maintaining the memory portion in the ACTIVE phase based on the read/program counter and/or a time counter not meeting respective threshold, or returning the memory portion to the IDLE phase based on the read/program counter or the time counter meeting respective threshold.

25. The method of claim 24, wherein returning the memory portion to the ACTIVE phase based on the executing comprises driving the even access line to the discharge voltage after driving the even access line to the read/program voltage.

26. The method of claim 24, wherein transitioning the memory portion from the IDLE phase to the ACTIVE phase further comprises resetting the read/program counter and/or the time counter.

27. The method of claim 24, wherein the counter is a per bank counter, and wherein the threshold is trimmable based on a temperature of the memory portion.

28. A system comprising a memory array and a controller configured to:
drive an even access line coupled to a memory cell to a discharging voltage through an even two-transistor driver comprising a P-type transistor and a N-type transistor, and
to drive an odd access line adjacent to the even access line to the discharging voltage through an odd two-transistor driver comprising a P-type transistor and a N-type transistor, during an IDLE phase;
drive the even access line to a floating voltage through the even two-transistor driver, and drive the odd access line adjacent to the even access line to the floating voltage through the odd two-transistor driver, during an ACTIVE phase; and
drive the even access line to a read/program voltage through the even two-transistor driver, and drive the odd access line adjacent to the even access line to a shielding voltage through the odd two-transistor driver, during a PULSE phase.

29. The system of claim 28, wherein the array of memory cells comprises a Self-Selecting Memory (SSM) or a 3D cross point (3D X Point) memory.

30. A method to operate a memory device having at least one even two-transistor driver comprising a P-type transistor and a N-type transistor, and at least one odd two-transistor driver comprising a P-type transistor and a N-type transistor, the method comprising:

during an IDLE phase:
    driving an even access line coupled to a memory cell to a discharging voltage through the even two-transistor driver, and
    driving an odd access line adjacent to the even access line to the discharging voltage through the odd two-transistor driver;
during an ACTIVE phase:
    driving the even access line to a floating voltage through the even two-transistor driver, and
    driving the odd access line adjacent to the even access line to the floating voltage through the odd two-transistor driver; and
during a PULSE phase:
    driving the even access line to a read/program voltage through the even two-transistor driver, and
    driving the odd access line adjacent to the even access line to a shielding voltage through the odd two-transistor driver.

* * * * *